US009910273B2

(12) United States Patent
Quenzer et al.

(10) Patent No.: US 9,910,273 B2
(45) Date of Patent: Mar. 6, 2018

(54) METHOD FOR PRODUCING STRUCTURED OPTICAL COMPONENTS

(71) Applicant: Fraunhofer-Gesellschaft zur Foerderung der angewandten Forschung e.V., Munich (DE)

(72) Inventors: Hans Joachim Quenzer, Itzehoe (DE); Ulrich Hofmann, Itzehoe (DE); Vanessa Stenchly, Meldorf (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 835 days.

(21) Appl. No.: 14/361,392

(22) PCT Filed: Sep. 28, 2012

(86) PCT No.: PCT/EP2012/004105
§ 371 (c)(1),
(2) Date: Oct. 9, 2014

(87) PCT Pub. No.: WO2013/079131
PCT Pub. Date: Jun. 6, 2013

(65) Prior Publication Data
US 2015/0040368 A1    Feb. 12, 2015

(30) Foreign Application Priority Data
Nov. 29, 2011    (DE) .................. 10 2011 119 610

(51) Int. Cl.
*G02B 27/00* (2006.01)
*G02B 5/02* (2006.01)
(Continued)

(52) U.S. Cl.
CPC ...... *G02B 27/0006* (2013.01); *B81C 1/00317* (2013.01); *B81C 1/00793* (2013.01);
(Continued)

(58) Field of Classification Search
CPC ............ G02B 27/0006; B81C 1/00317; B81C 1/00793
See application file for complete search history.

(56) References Cited

U.S. PATENT DOCUMENTS 5,542,978 A  *  8/1996  Kindt-Larsen .......... B29C 33/58
                                                    118/256
6,146,917 A     11/2000  Zhang et al.
(Continued)

FOREIGN PATENT DOCUMENTS

DE              4026046 A1    2/1992
DE      10 2008 012 384 A1    9/2009
(Continued)

OTHER PUBLICATIONS

H. Kahn, "Thermal expansion of low-pressure chemical vapor deposition polysilicon films", Materials Research Society, J. Mater. Res., vol. 17, No. 7, Jul. 2002, p. 1857, accessed Mar. 3, 2017.*
(Continued)

*Primary Examiner* — Alison L Hindenlang
*Assistant Examiner* — Jamel M Nelson
(74) *Attorney, Agent, or Firm* — Jacobson Holman, PLLC

(57) ABSTRACT

The method according to the invention is used for producing optical components, in particular covers for encapsulating micro-systems, wherein at least one reinforcing element, which is produced before being arranged, is arranged on a first substrate, as a result of which a stack is produced. This stack is heated after being connected to a second substrate, as a result of which the first substrate is deformed such that
(Continued)

at least one region, covered by the reinforcing element, of the first substrate is moved and/or is inclined or the first substrate is brought into contact with the reinforcing element. In an alternative method according to the invention, the reinforcing element is arranged on the second substrate, wherein this stack is then connected to the first substrate. The first substrate is subsequently heated and deformed such that a region of the first substrate is brought into contact with the reinforcing element.

29 Claims, 44 Drawing Sheets

(51) Int. Cl.
*G02B 26/08* (2006.01)
*B81C 1/00* (2006.01)
*G02B 1/118* (2015.01)

(52) U.S. Cl.
CPC ............ *G02B 1/118* (2013.01); *G02B 5/0242* (2013.01); *G02B 5/0278* (2013.01); *G02B 26/0833* (2013.01); *G02B 26/0841* (2013.01); *B81B 2201/042* (2013.01); *Y10T 29/49826* (2015.01)

(56) References Cited

U.S. PATENT DOCUMENTS

| | | |
|---|---|---|
| 6,951,119 B1 | 10/2005 | Quenzer et al. |
| 7,948,667 B2 | 5/2011 | Uchikawa |
| 8,151,600 B2 | 4/2012 | Eklund et al. |
| 2005/0184304 A1 | 8/2005 | Gupta et al. |
| 2005/0239228 A1 | 10/2005 | Quenzer et al. |
| 2007/0024549 A1 | 2/2007 | Choi et al. |
| 2010/0330332 A1* | 12/2010 | Quenzer ............... B81B 7/0067 428/141 |
| 2011/0049113 A1* | 3/2011 | Glaesemann ......... C03B 33/091 219/121.72 |
| 2011/0180887 A1 | 3/2011 | Rothacher |

FOREIGN PATENT DOCUMENTS

| | | |
|---|---|---|
| DE | 10 2008 042 106 A1 | 3/2010 |
| EP | 1 748 029 A2 | 1/2007 |
| WO | WO 2004/068665 A2 | 8/2004 |
| WO | WO 2007/069165 A2 | 6/2007 |

OTHER PUBLICATIONS

"Schott Technical Glasses", Schott North America, 2017, accessed at us.schott.com on Mar. 3, 2017.*
B. Bresseler, "[microproduction—toolmaking as a measure of a thing]"; http://www.aixtooling.de/index,html?content=/deutsch/aktuelles/aktuelles.html.
B. Bresseler, "Precision Glass Molding Technical Brief", pp. 1-17, Mar. 2007; http://www.rpoptics.com/Precision%20Glass%20Molding%20Technical%20Brief_2.pdf.
Chuan Pu et al., Surface Micromachined Integrated Optic Polarization Beam Splitter; IEEE, vol. 10, No. 7, Jul. 1998.
Lih Lin et al., Micro-Electro-Mechanical Systems (MEMS) for WDM Optical-Crossconnect Networks, IEEE, 1999.
Jenq-Yang Chang et al., "Realization of Free-Space Optical Pickup Head With Stacked Si-Based Phase Elements", IEEE Photonics Tech. Letters.
Kyounggsik Yu et al., "Micromachined Fourier transform spectrometer on silicon optical bench platform", Sensors & Actuators, A130-131 (2006) pp. 523-530.
Xinghua Li et al., "Deep reactive ion etching of Pyrex glass using SF6 plasma", Sensors & Actuators A87 (2001), pp. 139-145.
Ciprian Iliescu et al., Deep Wet & Dry Etching of Pyrex Glass: A Review.

* cited by examiner

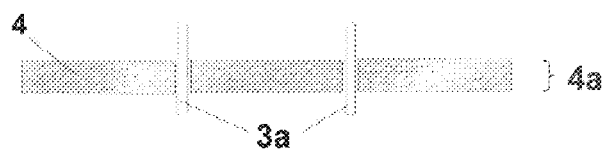
Fig. 3
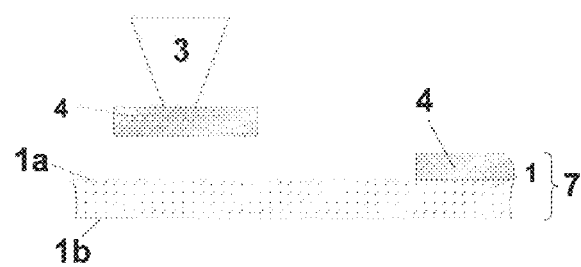
Fig. 3a
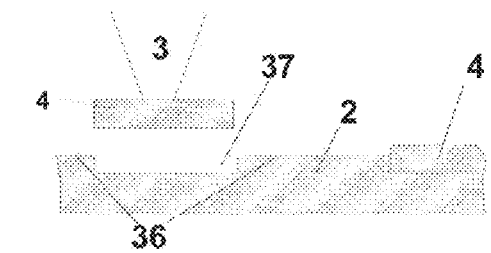
Fig. 3b
Fig. 3b_1
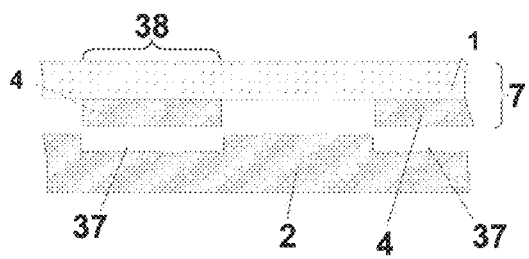
Fig. 3b_2

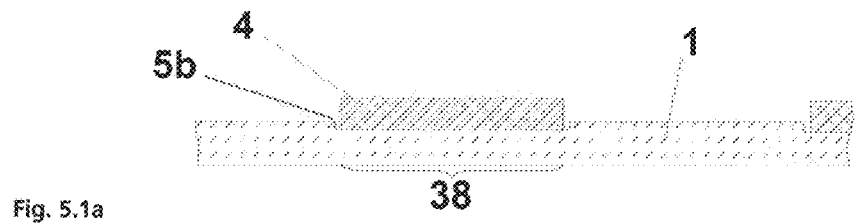
Fig. 5.1a
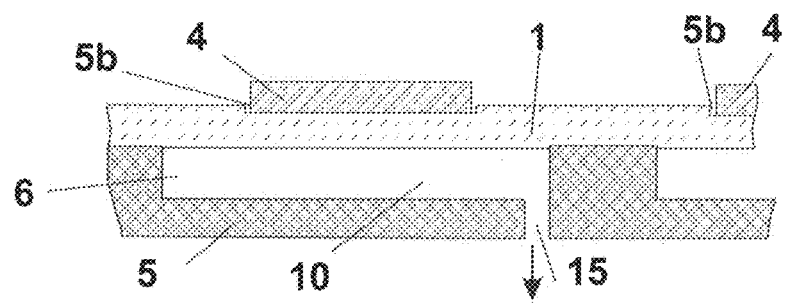
Fig. 5.1b
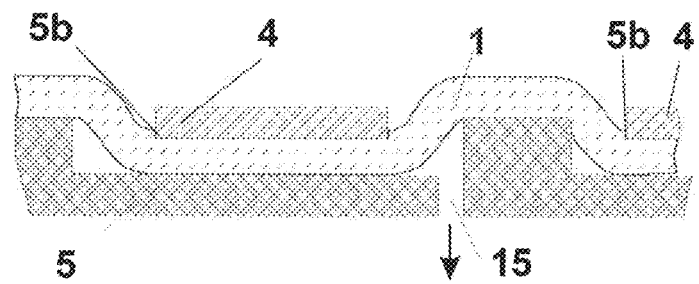
Fig. 5.1c
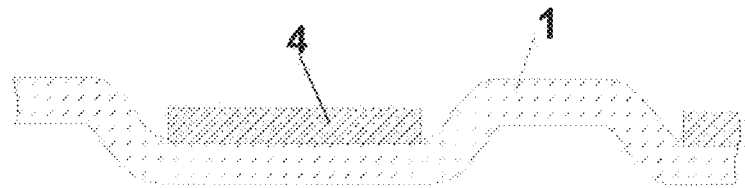
Fig. 5.1d

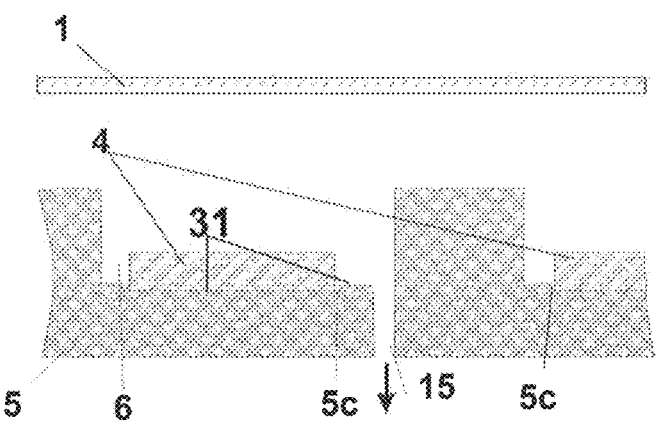
Fig. 5.2a
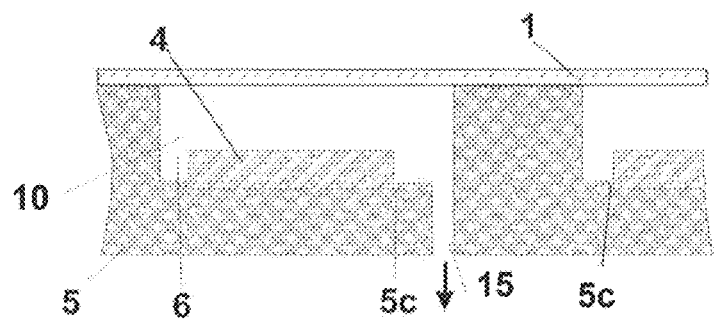
Fig. 5.2b
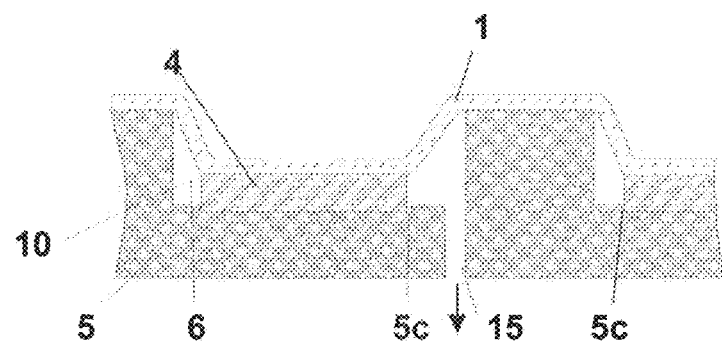
Fig. 5.2 c

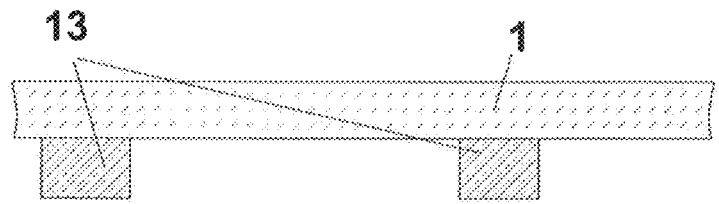
Fig. 5.3a
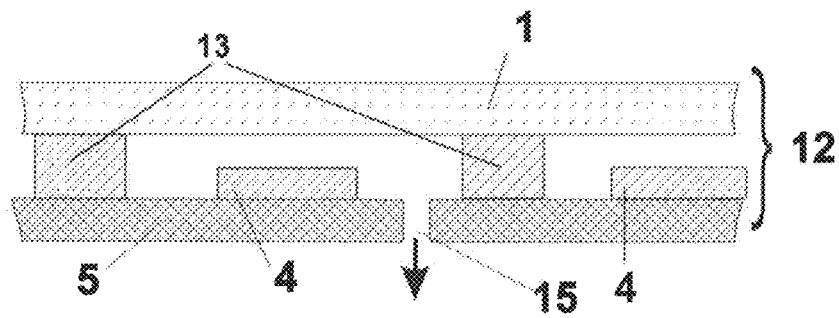
Fig. 5.3b
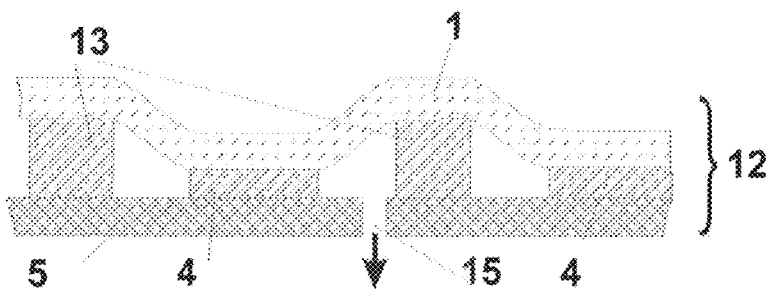
Fig. 5.3c
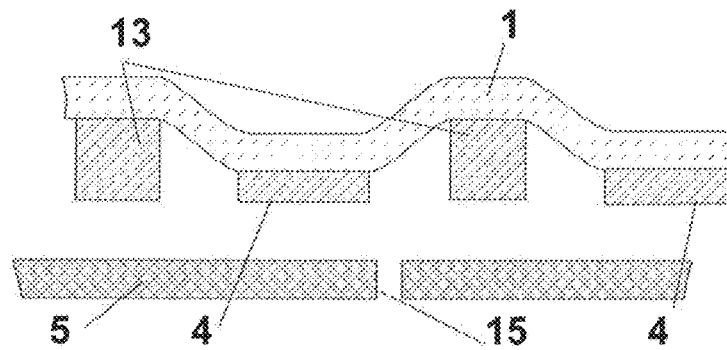
Fig. 5.3d

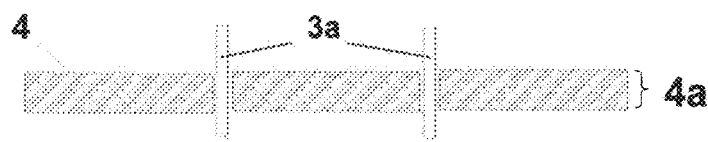
Fig. 5.4a
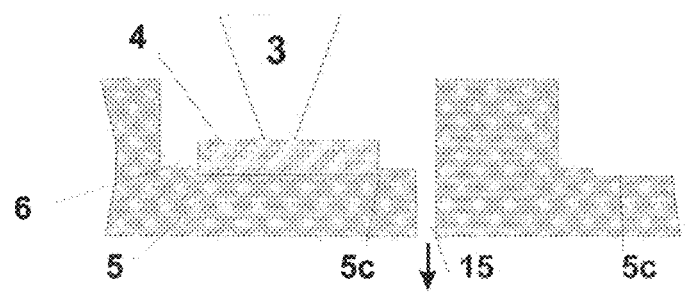
Fig. 5.4b
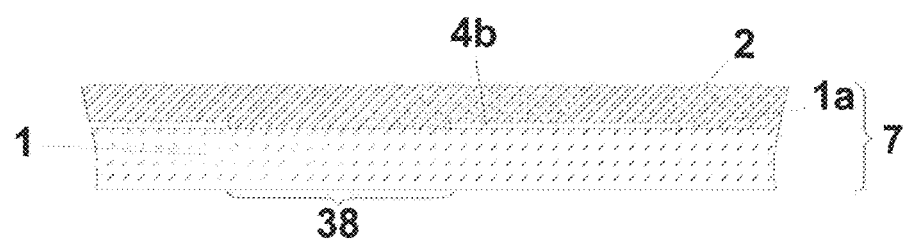
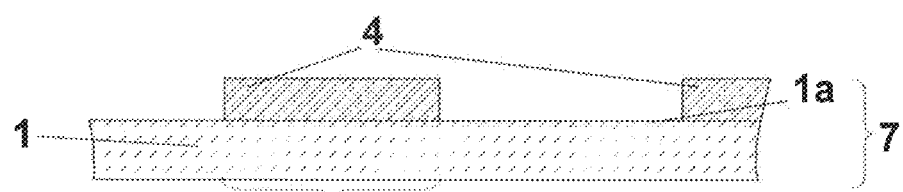
Fig. 5.4c

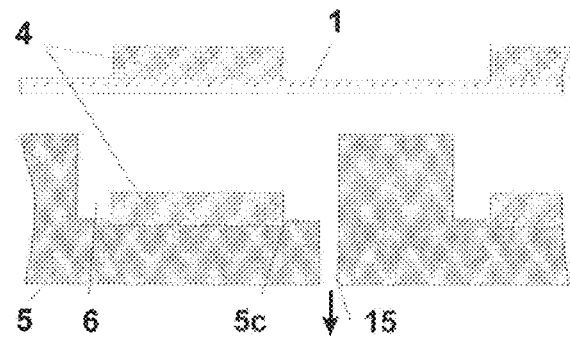
Fig. 5.4d
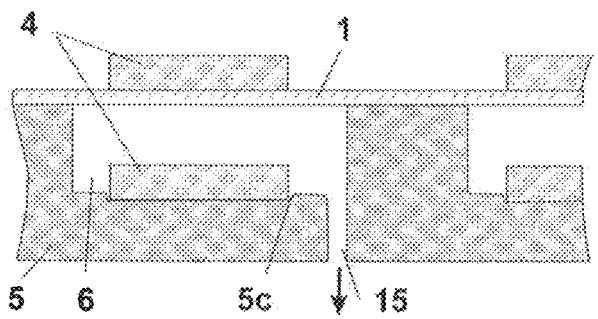
Fig. 5.4e
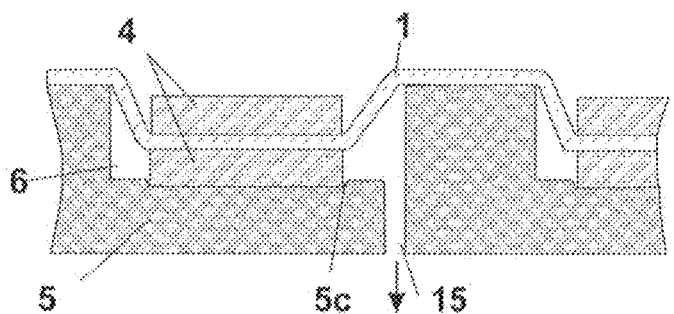
Fig. 5.4f

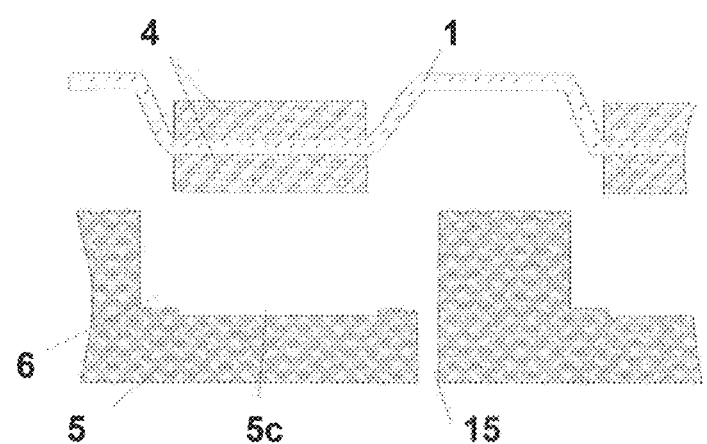
Fig. 5.4g
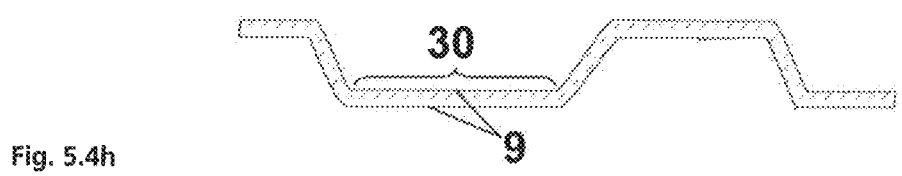
Fig. 5.4h

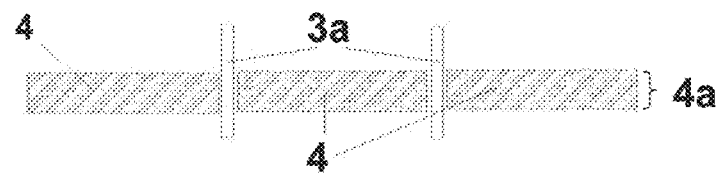
Fig. 6.1a
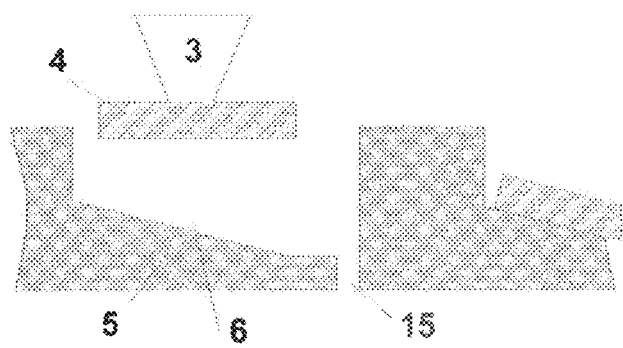
Fig. 6.1b
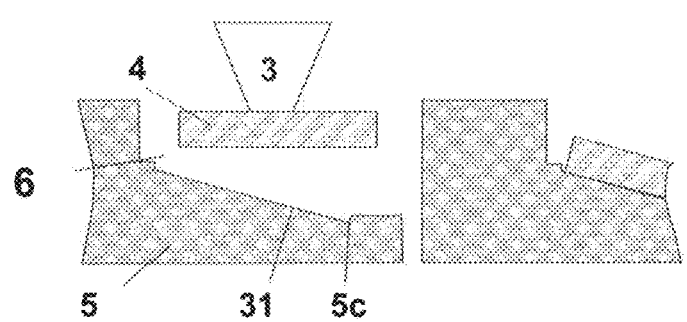
Fig. 6.1b_1
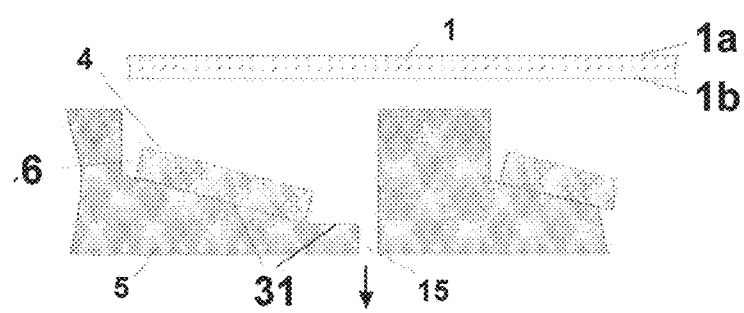
Fig. 6.1c

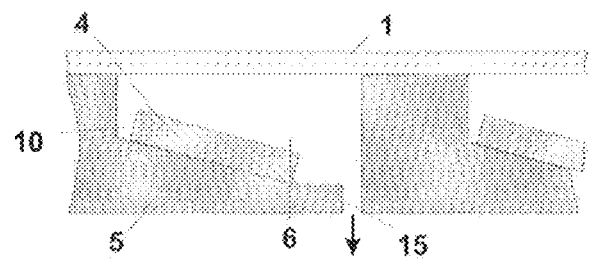
Fig. 6.1d
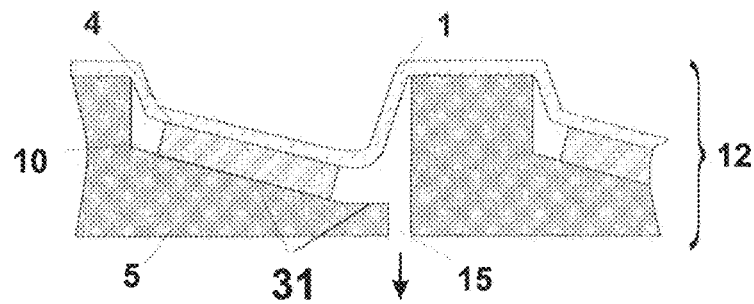
Fig. 6.1e
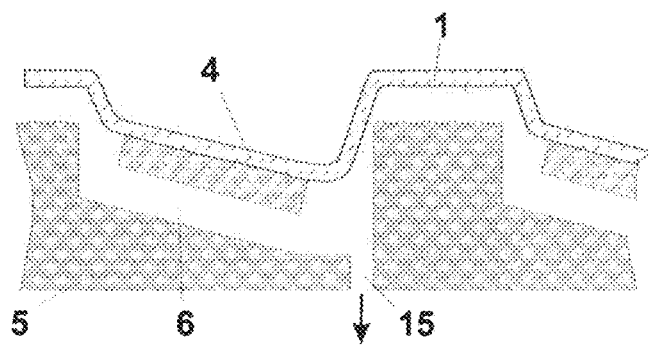
Fig. 6.1f
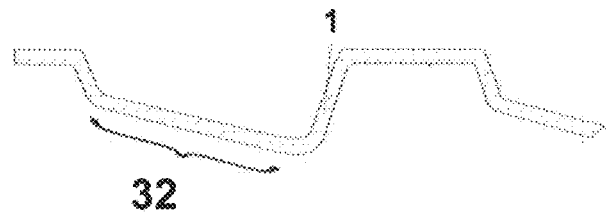
Fig. 6.1g

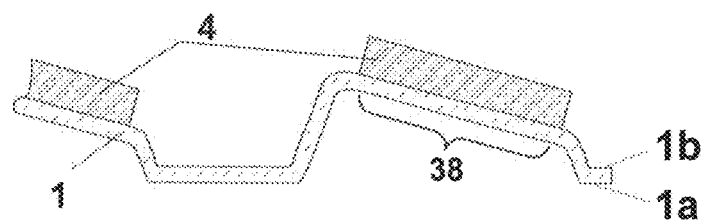
Fig. 6.2a
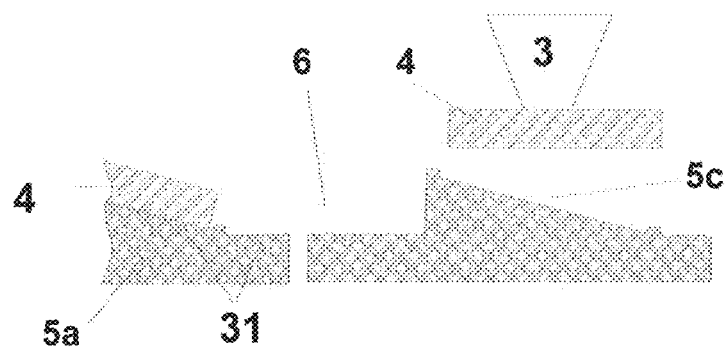
Fig. 6.2b
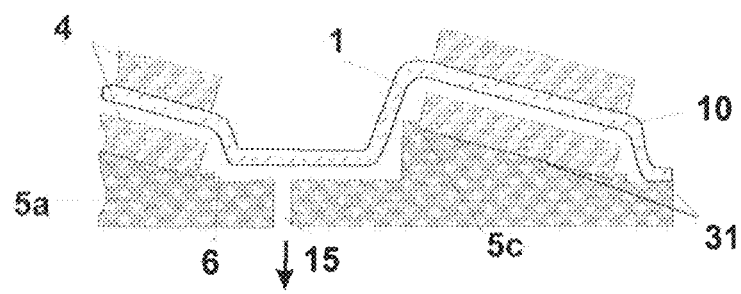
Fig. 6.2c
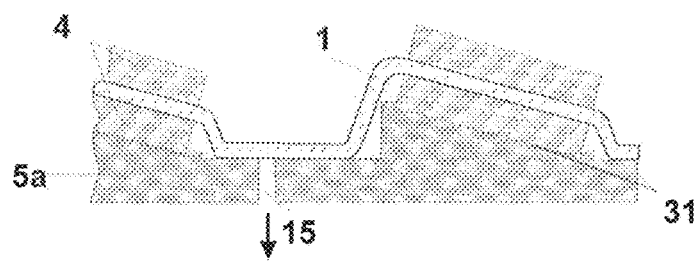
Fig. 6.2d

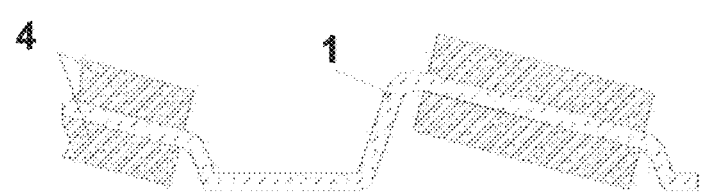
Fig. 6.2e
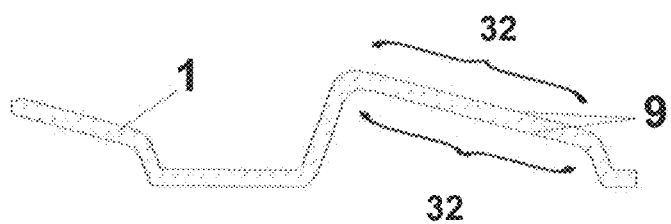
Fig. 6.2f

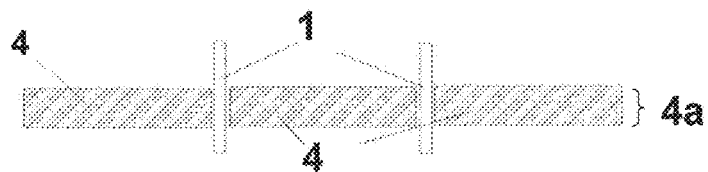
Fig. 6.3a
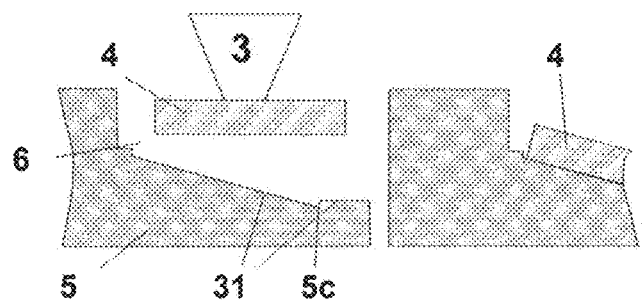
Fig. 6.3b
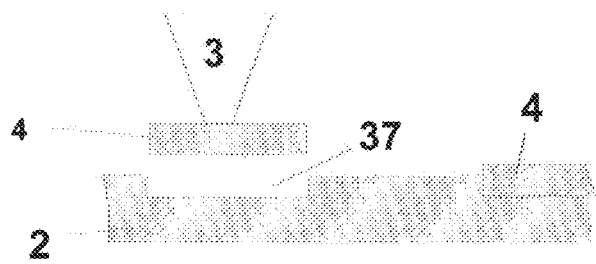
Fig. 6.3c
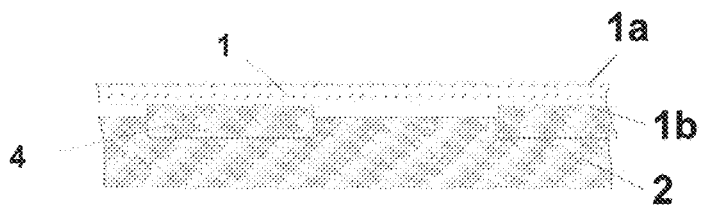
Fig. 6.3d
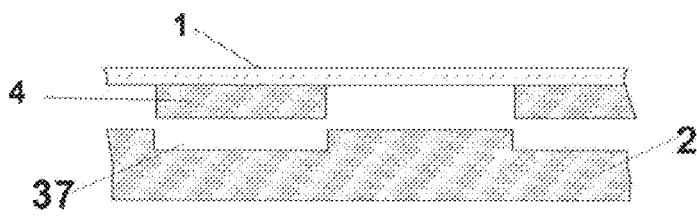
Fig. 6.3e

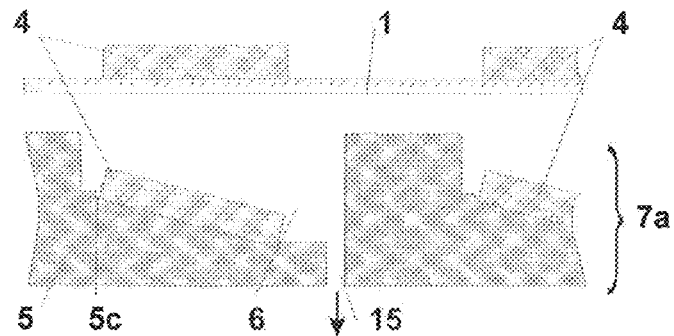
Fig. 6.3f
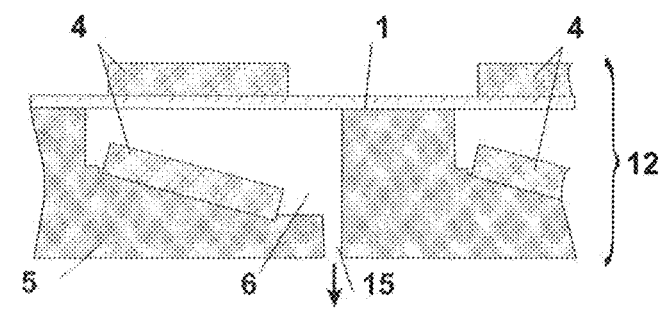
Fig. 6.3g
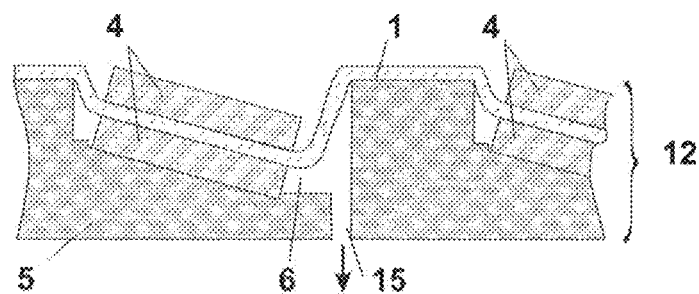
Fig. 6.3h
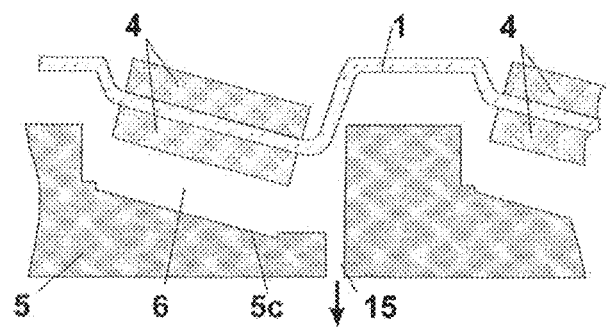
Fig. 6.3i

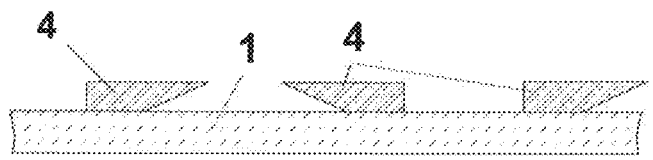
Fig. 7.1a
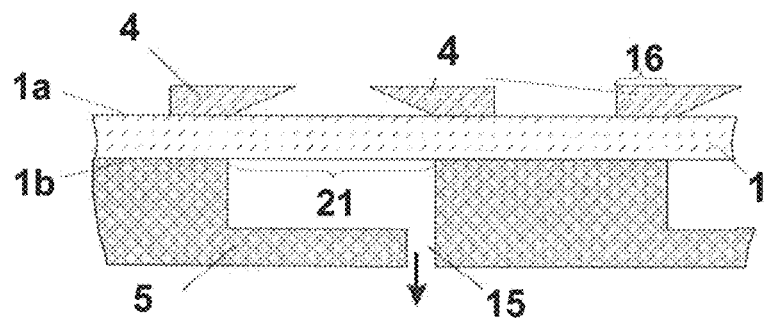
Fig. 7.1b
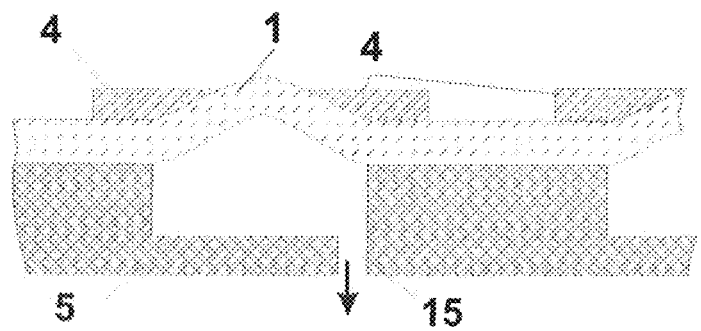
Fig. 7.1c
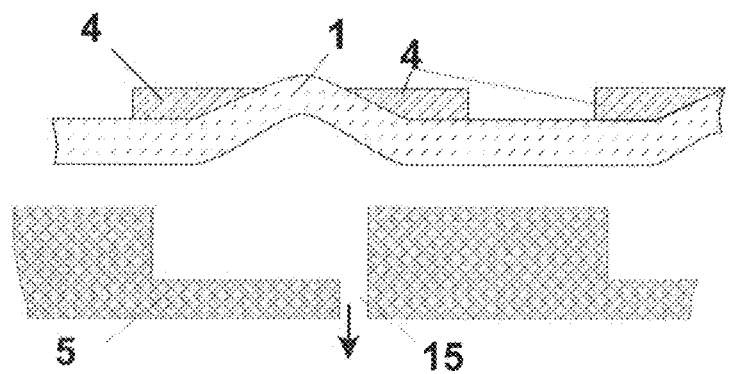
Fig. 7.1d

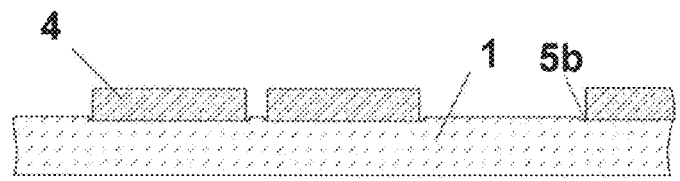
Fig. 7.2a
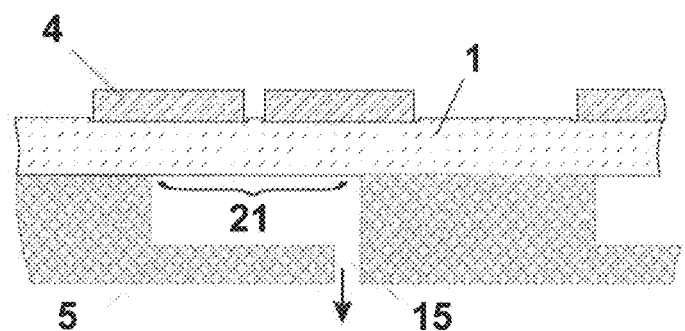
Fig. 7.2b
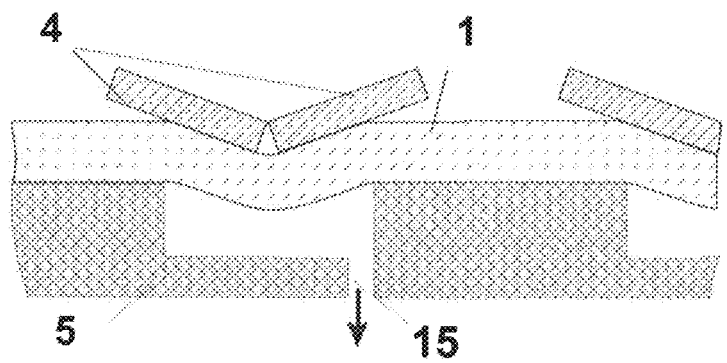
Fig. 7.2c
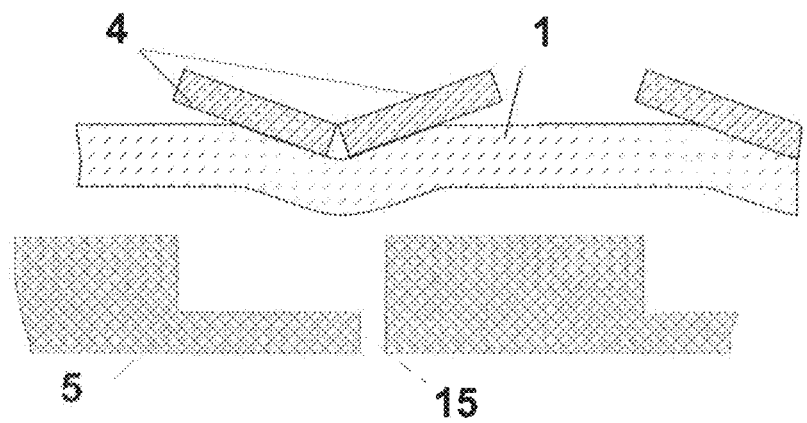
Fig. 7.2d

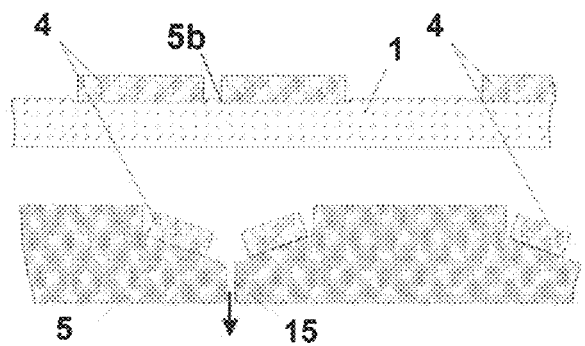
Fig. 7.3 a
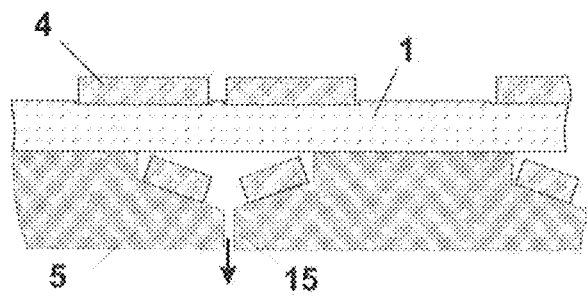
Fig. 7.3 b
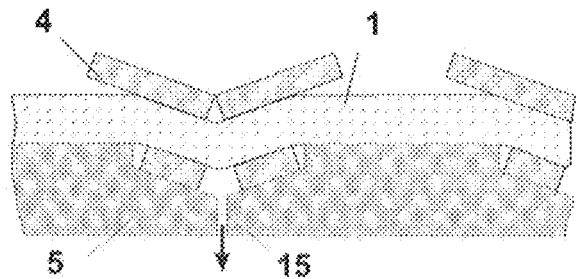
Fig. 7.3 c
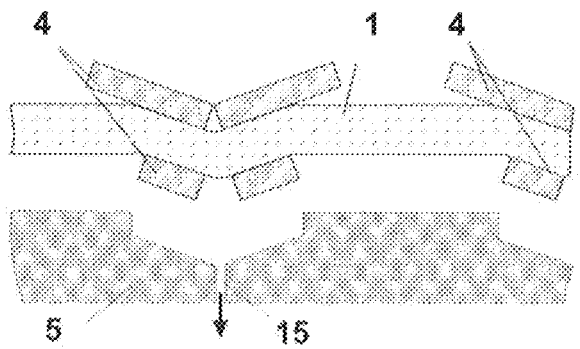
Fig. 7.3 d

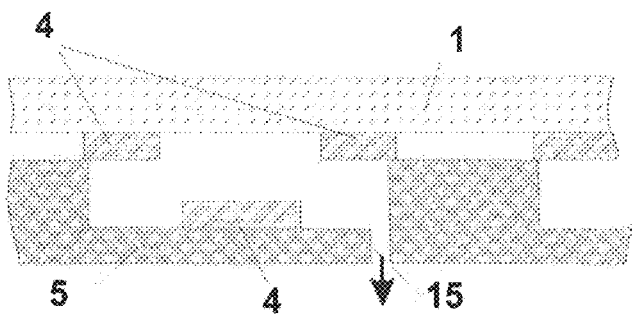
Fig. 8.1a
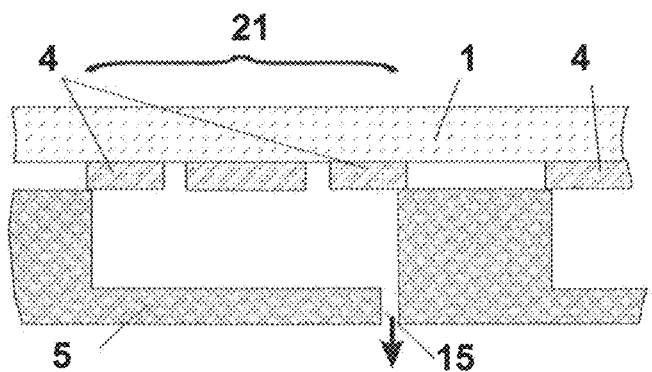
Fig. 8.1a_1
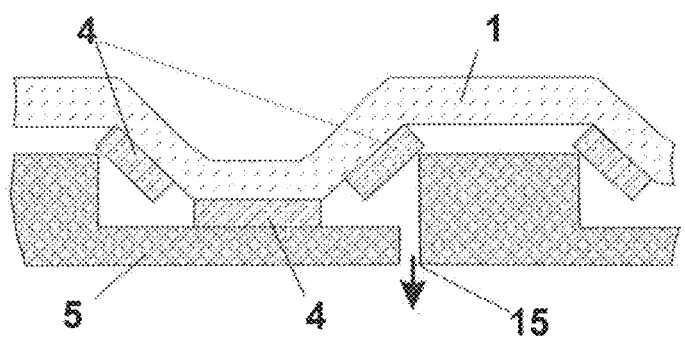
Fig. 8.1b
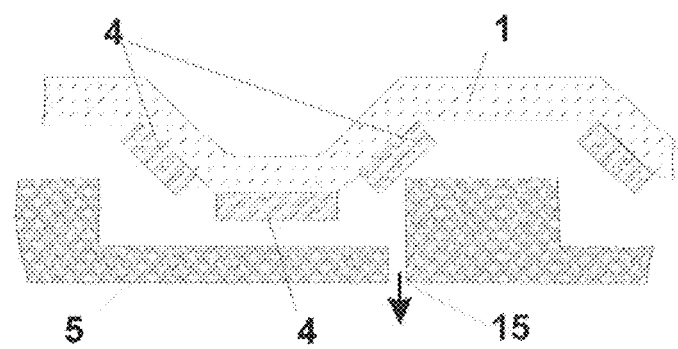
Fig. 8.1c

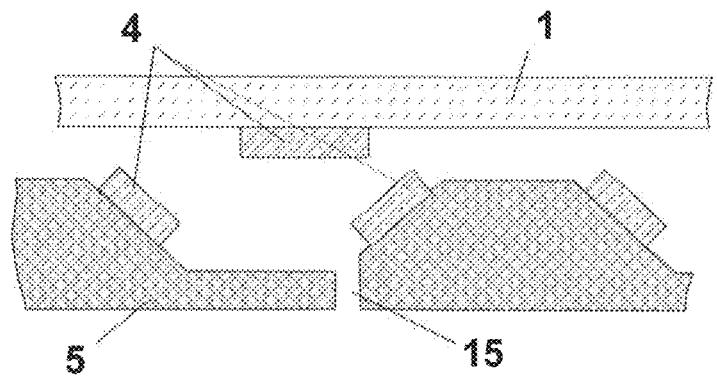
Fig. 8.2a
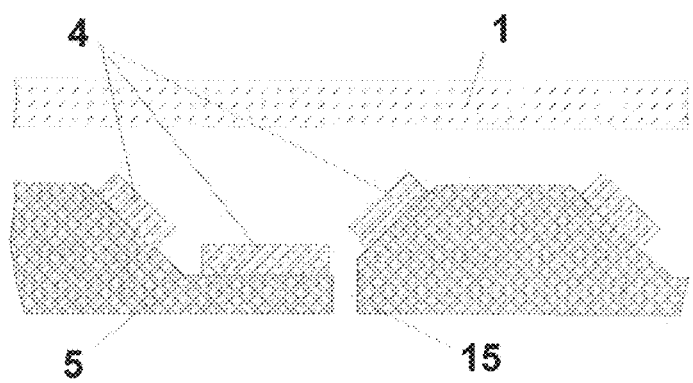
Fig. 8.2a_1
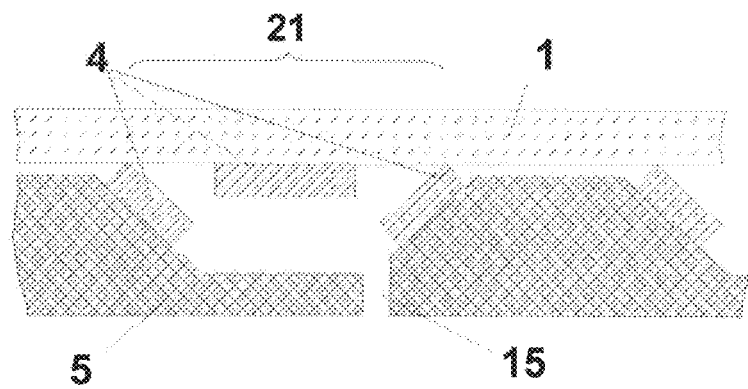
Fig. 8.2b

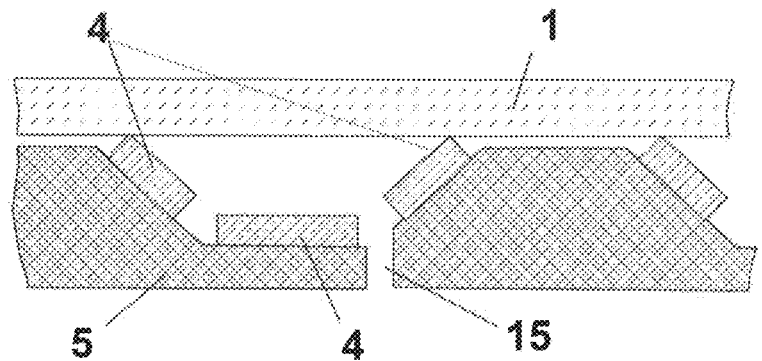
Fig. 8.2b_1
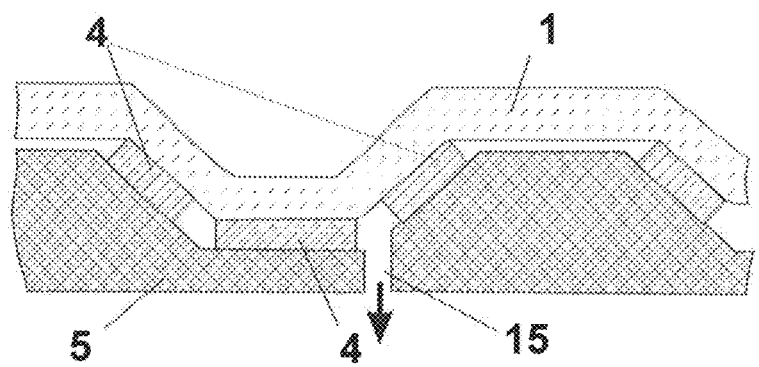
Fig. 8.2c
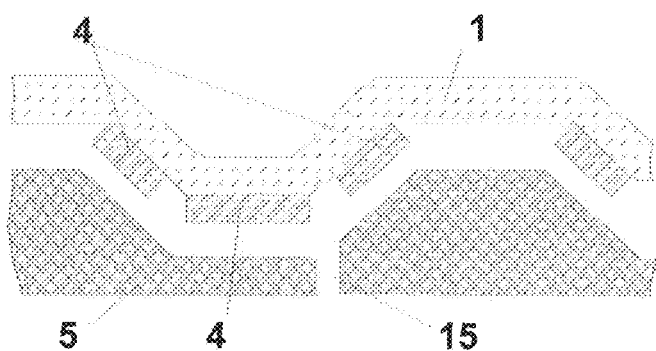
Fig. 8.2d

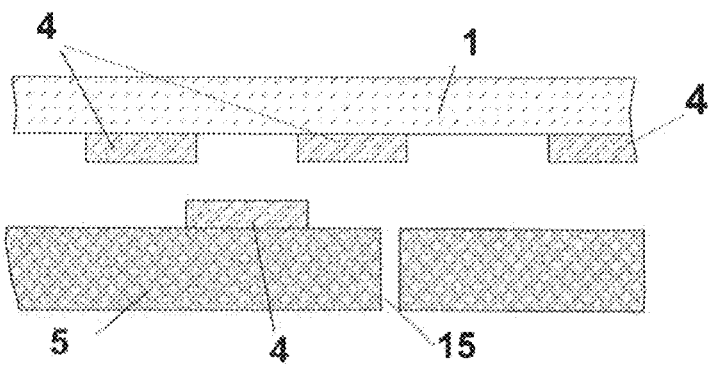
Fig. 8.3a
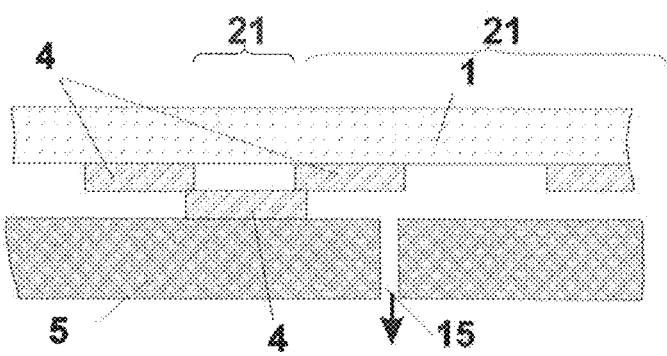
Fig. 8.3b
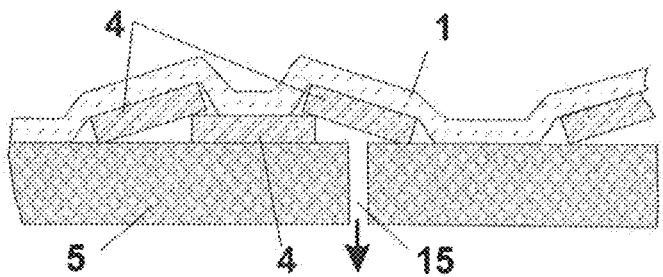
Fig. 8.3c
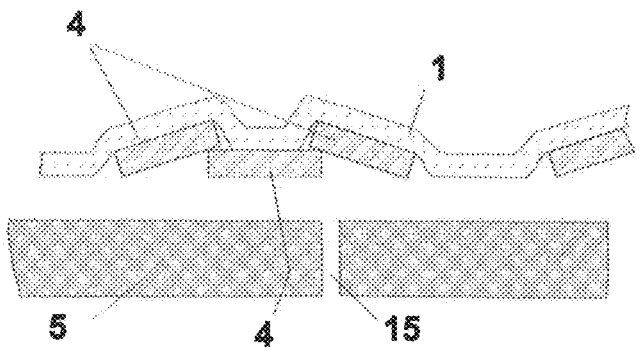
Fig. 8.3d

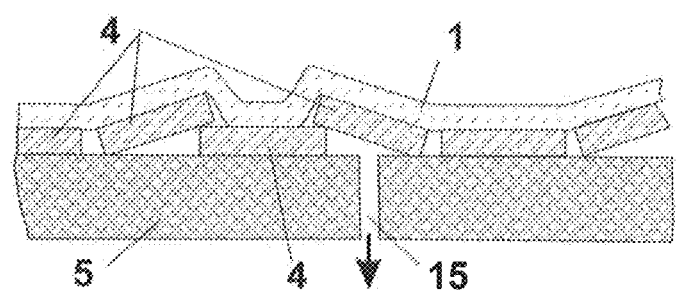
Fig. 8.3d_1

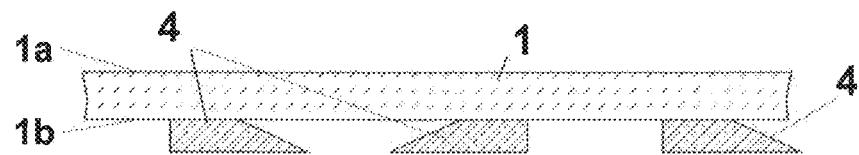
Fig. 8.4a
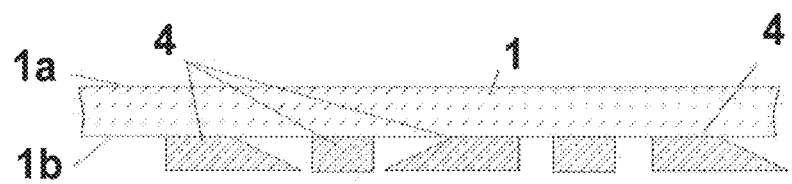
Fig. 8.4a_1
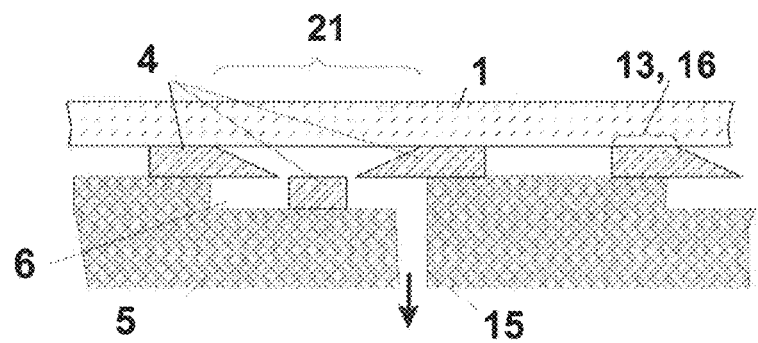
Fig. 8.4b
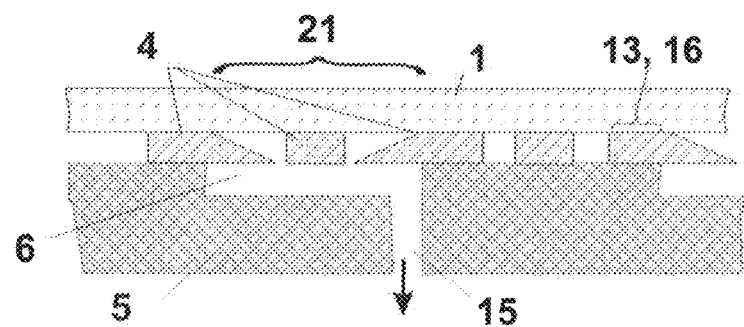
Fig. 8.4b_1

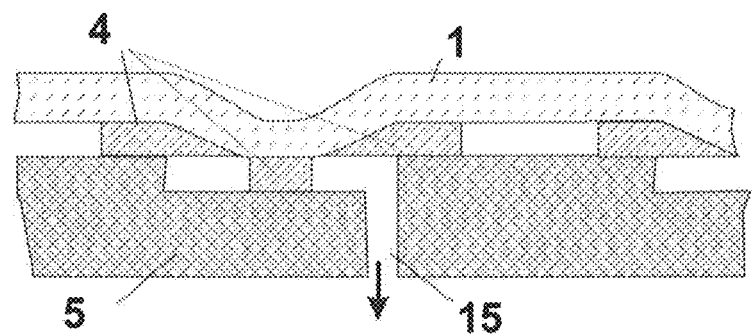
Fig. 8.4c
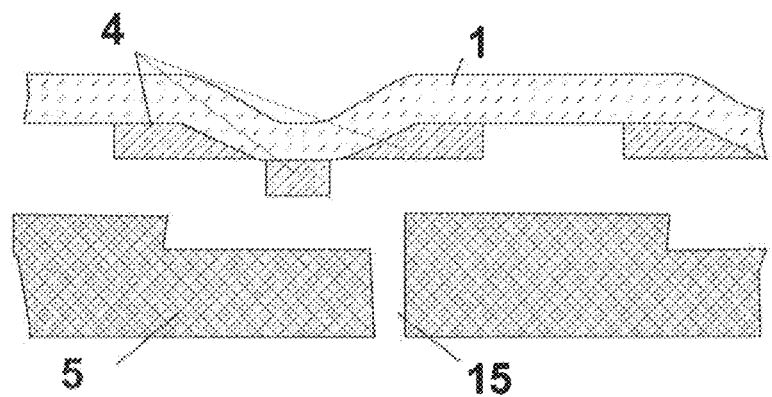
Fig. 8.4d

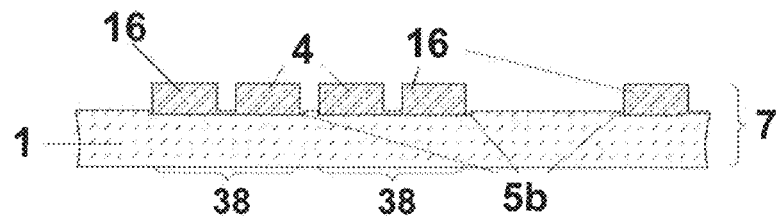
Fig. 9.1a
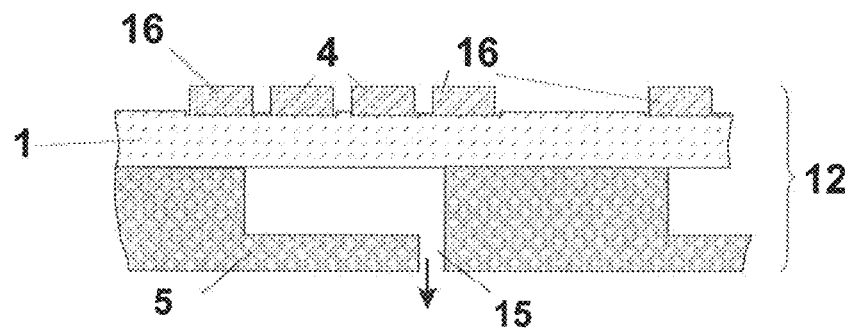
Fig. 9.1b
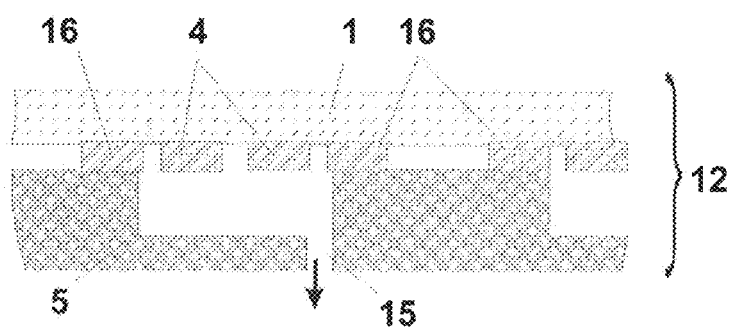
Fig. 9.1b_1

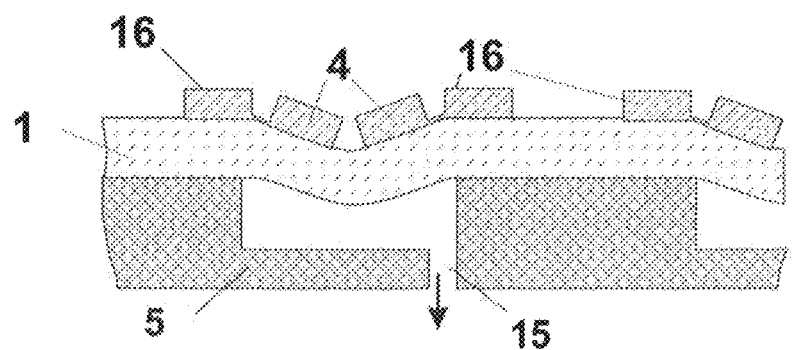
Fig. 9.1c
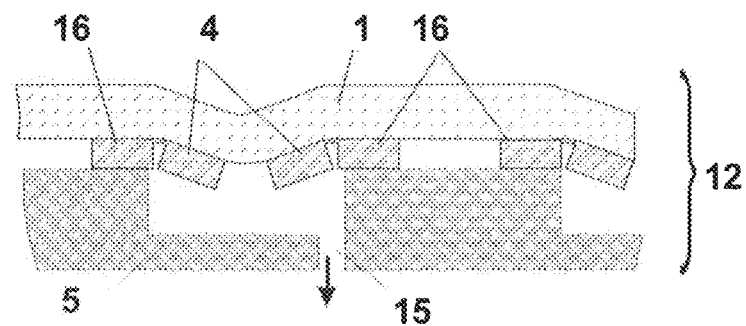
Fig. 9.1c_1
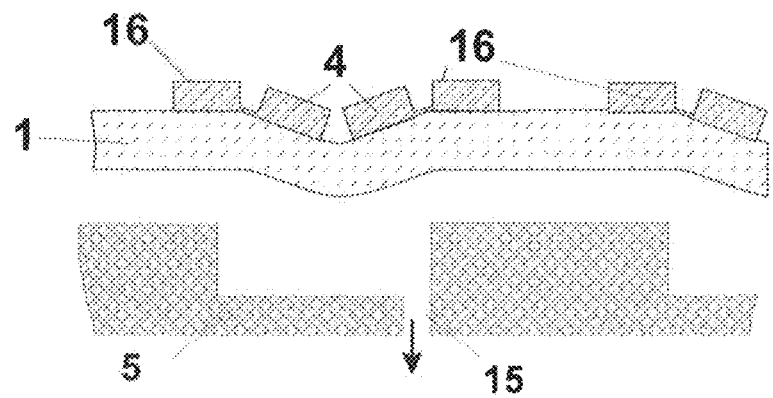
Fig. 9.1d

Fig. 12e_1

METHOD FOR PRODUCING STRUCTURED OPTICAL COMPONENTS

TECHNICAL AREA

The invention relates to a method for producing structured optical components, in particular covers for encapsulating microsystems, which have to fulfill an optical function in particular.

A cover for encapsulating microsystems (for example, MOEMS, MEMS), which are typically arranged on a carrier substrate, is generally to offer at least protection against contaminants and simultaneously is not to impair the mechanical and/or optical functionality of the microsystems. If the functionality of the microsystems is not to be restricted only to movements in or parallel to the carrier substrate plane, respectively, but rather is also to provide movements perpendicular to the carrier substrate plane, a cover must ensure freedom of movement typically corresponding to the microsystems. This requires structuring methods which enable a high surface quality of the optically functional regions, for example.

PRIOR ART

If the microsystems are to exert an optical function or if specific parameters or physical variables of the microsystems are to be optically measured—for example, determination of the deflection by means of interferometer or by analysis of video sequences—an optically transparent cover is then typically required. (FIG. 1a)

In WO 2004/1068665, a wafer level packaging method for MOEMS is described, which provides a cover made of glass. Before the encapsulation process, the carrier wafer having the MOEMS is isolated, however. The separate unencapsulated chips (DIEs) resulting therefrom are placed on a new substrate, mounted, contacted, and only subsequently encapsulated. Depressions in the cover can be generated using known embossing and etching methods and/or by the use of spacers, for example, made of silicon.

In U.S. Pat. No. 6,146,917, a wafer level packaging method for MEMS/MOEMS is described, in which a cover wafer, which is provided with depressions, made of silicon or glass is connected by fusion bonding or anodic bonding to the carrier wafer, from which a hermetically sealed housing results. The production of the required depressions of 50 to 150 µm depth in the cover wafer made of silicon can be performed by wet-chemical etching by means of KOH solution.

In US 2005/0184304, a wafer level packaging method for encapsulating surface-micromechanical manufactured micromirror arrays is presented. A cover wafer made of glass has depressions which are used as optical windows and can also have corresponding finishing layers. The depressions in the cover wafer can have depths of greater than 100 µm and are generated using common shaping methods, for example, etching, casting, or embossing, or by the use of spacers.

All of the listed documents share the feature that the optical windows of the cover are embodied in parallel to the substrate plane of the carrier substrate (carrier substrate plane), in particular the carrier wafer, and therefore to the MEMS/MOEMS arranged thereon. Furthermore, covers having depressions which are delimited by optical windows embodied as inclined to the carrier substrate plane are described in the prior art.

As described in WO 2007/069165 and U.S. Pat. No. 7,948,667, blanking out of reflections (FIG. 1b) can be achieved by inclined optical windows.

According to US 2007/0024549 A1, covers having inclined optical windows can also be manufactured, which allow an encapsulation on the wafer level. The shaping of the cover or the implementation of the required depressions, respectively, is performed using known embossing and shaping methods.

Such shaping methods include, for example, glass deep-drawing and blank pressing. In particular blank pressing is also used to produce optical components, for example, lenses; (see Bernd Bresseler, "Mikroproduktion—Der Werkzeugbau als Ma.β der Dinge (microproduction—tool-making as a measure of the thing)" on the Internet page http://www.aixtooling.de/index.htnml?content=/deutsch/aktuelles/aktuelles.html and see Bernd Bresseler, Precision Optics "Precision Glass Molding Technical Brief" on the Internet page http://www.rpoptics.com/Precision420Glass420Molding %20T echnical %20Brief_2.pdf).

Optical components which have flat or plane-parallel surfaces, for example, mirrors or partially-transmissive mirrors and beam splitters (documents Optical components which have flat or plane-parallel surfaces, for example, mirrors or partially-transmissive mirrors and beam splitters (documents Chuan Pu, Zuhua Zhu and Yu-Hwa Lo "Surface Micromachined Integrated Optic Polarization Beam Splitter"; IEEE PHOTONICS TECHNOLOGY LETTERS, Vol. 10, No. 7, JULY 1998 and Lih Y. Lin and Evan L. Goldstein "Micro-Electro-Mechanical Systems (MEMS) for WDM Optical-Crossconnect Networks", IEEE 1999) are typically produced from silicon in microsystem technology. Thus, for example, inclined mirrors may be implemented by anisotropic wet-chemical etching processes, for example, by means of KOH (document Jenq-Yang Chang, Chih-Ming Wang, Chien-Chieh Lee, Hsi-Fu Shih and Mount-Learn Wu "Realization of Free-Space Optical Pickup Head With Stacked Si-Based Phase Elements"; IEEE PHOTONICS TECHNOLOGY LETTERS).

In the document Kyounggsik Yu, Daesung Lee, Uma Krishnamoorthy, Namkyoo Park and Olav Solgaard "Micromachined Fourier transform spectrometer on silicon optical bench platform"; Sensors and Actuators A130-131 (2006) 523-530, microoptical beam splitters and inclined mirrors are also produced by means of various etching methods, wherein reference is made to a high quality, in particular a slight roughness, of the optically functional surfaces. Surfaces having an RMS surface roughness of less than 20 nm may be achieved in silicon by means of wet-chemical KOH etching. However, such surfaces can only be implemented in standard silicon wafers having specific angles of inclination, which are predefined by the crystal structure of silicon.

The production of corresponding optical components based on glass, for example, borosilicate glass, by means of etching methods typically results in surfaces, the roughness of which is not satisfactory for optical applications (see documents Xinghua Li, Takashi Abe, Masayoshi Esashi "Deep reactive ion etching of Pyrex glass using $SF_6$ plasma", Sensors and Actuators A87, 2001, pp. 139-145 and Ciprian Iliescu, Kwong Luck Tan, Francis E. H. Tay, Jianmin Miao "Deep Wet and Dry Etching of Pyrex Glass: A Review").

A method for producing optical components, in particular covers having inclined optical windows, is additionally described in DE 102008012384. By way of the use of reinforcing elements and by means of glass flow, the regions functioning as optical windows may be inclined in a protected and stabilized manner, whereby high-quality inclined or displaced optical windows may be implemented. A disadvantage of the method is that the implementation of the reinforcing elements is linked to a relatively high material outlay, since large regions of the starting layer must be removed by etching processes.

BACKGROUND AND SUMMARY DESCRIPTION OF THE INVENTION

The present invention is therefore based on the object of overcoming the disadvantages of the prior art and providing a cost-effective and more flexible method for producing optical components, in particular covers, having displaced and/or inclined regions and high surface quality.

According to the present invention, the object is achieved by a method as claimed in claim 1 or a method as claimed in claim 2, respectively, for producing optical components, in particular a cover. The dependent claims teach advantageous refinements.

The methods according to the invention as claimed in claim 1 and claim 2 are used to produce optical components, in which a specific region or specific regions or faces, in particular surfaces, are embodied as inclined and/or displaced in relation to at least one substrate plane of the first substrate. The optical component has at least one optical element, for example, an optical window, a mirror or partially-transmissive mirror, respectively, a beam splitter, a prism, and/or an interference filter, or the optical component consists of at least one optical element. The surface(s) of an optical window, through which the radiation used in the application is incident in the optical window and/or is decoupled again, represent(s) the transmission surface(s) of an optical window. The method according to the invention can be used, for example, to produce a cover having one or more optical windows to encapsulate microsystems, which have to fulfill an optical function in particular and are typically applied or arranged on a carrier substrate. A silicon wafer is frequently used as the carrier substrate, on which the microsystems (for example, MEMS, MOEMS) to be encapsulated are generated by surface-micromechanical or volume-micromechanical processes.

The method according to the invention as claimed in claim 1 for producing optical components has the following steps:
providing a first substrate and a second substrate,
providing at least one reinforcing element by detaching it from a reinforcing substrate,
generating a stack by arranging the at least one reinforcing element on the first substrate, whereby the reinforcing element covers a region of the first substrate,
bringing the second substrate into contact with the stack,
heating and deforming the first substrate such that at least a part of the region of the first substrate covered by the at least one reinforcing element is displaced and/or inclined, and/or a region of the first substrate is brought into contact with the at least one reinforcing element.

The first substrate represents the starting substrate or base substrate for the optical component. To ensure a high quality of the optical component, in particular the surfaces, the two substrate sides of the first substrate or their surfaces which represent the starting surfaces for an optical window or its transmission surfaces, for example, are preferably embodied as polished. The two substrate sides preferably accordingly have a RMS surface roughness less than or equal to 25 nm, preferably less than or equal to 15 nm, particularly preferably less than or equal to 5 nm.

The two substrate sides of the first substrate are preferably embodied as flat (planar) and/or plane-parallel to one another.

To meet optical quality demands, the two substrate sides of the first substrate preferably have a flatness deviation of less than one-fourth of the wavelength of the electromagnetic radiation used in the application, wherein particularly preferably wavelengths from the ultraviolet up into the infrared wavelength range (for example, between approximately 200 nm and approximately 15 μm) are used. Accordingly, in the case of longer-wave light, for example, having a wavelength of 720 nm, values for the flatness deviation less than 180 nm are advantageous. If shorter-wave light having wavelengths less than 440 nm are used, the requirements on the substrate sides rise, so that values for the flatness deviation less than 110 nm are preferred.

The plane-parallelism deviation of the two substrate sides of the first substrate preferably has values less than 10 μm.

With such surface properties, the first substrate offers the best conditions for an optical component, which causes, for example, smaller deviations and less beam widening of the optical beam path, which results in less corruption of the optical signals.

The values for the flatness deviation and plane-parallelism deviation and also for the RMS surface roughness were determined by means of interferometric measuring methods. For the measurements, the white-light and phase interferometer MicroMap 512 from Atos or VEECO Wyko NT 1100 from Veeco was used.

Furthermore, the first substrate is preferably to have a homogeneous material structure, to avoid undesired refractions and/or deflections of the radiation due to the optical component produced from the first substrate.

A variety of optical components are to be transmissive for the electromagnetic radiation used in the application at least in partial regions, typically in their entirety. In the case of most optical applications, the highest possible level of transparency of these regions transmissive for electromagnetic radiation used in the application is required, so that a laser beam reaches the microsystem as uninfluenced as possible, for example.

Accordingly, the first substrate preferably contains glass and/or a glasslike material or the first substrate consists of glass and/or a glasslike material at least in one partial region. Glasslike materials are understood according to the invention as materials which are similar to glasses as a result of their thermodynamic properties (amorphous structure, glass transition temperature), although their chemical composition differs from those of the silicate glasses. The artificial glasses known in chemistry or organic vitroids such as polymethyl methacrylate (PMMA), polycarbonate, and polystyrene are mentioned here as examples.

Particularly preferred glasses are silicate glasses, in particular borosilicate glasses, since borosilicate glasses are very chemical-resistant and temperature-resistant. The temperature resistance and insensitivity of the borosilicate glasses to sudden temperature variations are a consequence of their low coefficient of thermal expansion. In addition, the transmittance is very high at over 90%, in particular in the wavelength range visible to humans.

In addition to one or more first substrates, at least one second substrate is provided.

The second substrate preferably contains a semiconductive material or the second substrate consists of a semiconductive material at least in partial regions. In particular semiconductor wafers, preferably silicon wafers, are used as the second substrate, whereby the mature and well-controllable processes of semiconductor technology, in particular silicon technology are usable.

The second substrate—in particular the region(s) of the second substrate which is/are brought into contact directly or indirectly (for example, via support structures) with the stack made of first substrate and reinforcing element—preferably contains high-temperature-resistant materials, in particular graphite, or consists thereof. Because of a lesser tendency to connect to the first substrate, in particular to glass, and a low level of wear thus caused, such substrates may be used multiple times or used over a longer period of time (longer service life), respectively.

The second substrate preferably has at least one third depression, which is preferably implemented on the side of the second substrate which is brought into contact with the stack made of first substrate and reinforcing element, or which faces toward the stack made of first substrate and reinforcing element, in particular the first substrate, during the method step of bringing into contact (the second substrate with the stack made of first substrate and reinforcing element) and/or during the method step of heating and deforming. The third depression of the second substrate is preferably between approximately 100 µm and approximately 1000 µm, particularly preferably several millimeters deep, so that deformation-related deflections of the first substrate and therefore in particular the depths of the first depressions are variable over a broad range.

In a further method step, at least one reinforcing element is provided by detaching it from at least one reinforcing substrate, wherein the reinforcing substrate is preferably embodied as a plate or wafer, in particular as a silicon or glass wafer. A variety of reinforcing elements may thus be produced from one or more reinforcing substrates and the processing steps for ensuring the desired strength or thickness of the reinforcing elements may be reduced or optimized, respectively.

In a preferred embodiment, the reinforcing substrate and/or the at least one reinforcing element contain a semiconductive material or the reinforcing substrate and/or the reinforcing element consist of a semiconductive material at least in partial regions. A particularly preferred material is silicon, since the mature and well-controllable processes of semiconductor technology, in particular silicon technology, can be used if it is employed. However, glasses which have a higher melting point than the first substrate (for example, high-melting-point glasses), are also suitable as the reinforcing element and/or reinforcing substrate, for example. Particularly preferred materials for the reinforcing element and/or the reinforcing substrate have a coefficient of thermal expansion which comes as close as possible to the coefficient of thermal expansion of the material of the first substrate or is as identical as possible thereto, respectively. The difference of the coefficients of thermal expansion is preferably to be less than or equal to 5 ppm/° K, particularly preferably less than or equal to 1 ppm/° K. Mechanical tensions, which can arise during the cooling due to contraction at different strengths of the first substrate and the reinforcing element and which could result in damage to the first substrate and/or the reinforcing element or the optical component, may thus be reduced.

The reinforcing element is provided by detaching it from or out of the reinforcing substrate. Preferred detachment methods are sawing, laser cutting or laser machining, fracture (possibly with previous scoring), and/or etching. In comparison to the prior art, according to which the reinforcing element is generated, for example, by etching a layer deposited on the first substrate and therefore by way of a comparatively high material ablation, the reinforcing substrate and therefore the starting material for the reinforcing element can be used substantially more effectively by a production process preferably occurring before the arrangement of the reinforcing element, for example, by sawing, laser cutting, fracture, or etching. The manufacturing costs may be reduced in this way and by the saving connected therewith of further process steps, for example, lacquer application, exposure, lacquer structuring, lacquer removal.

The production of the reinforcing elements before the arrangement additionally has the advantage that reinforcing elements made of various materials (for example, of multiple reinforcing substrates) and having different dimensions (for example, thickness) or shapes and also having various properties (for example, with respect to transparency, reflectiveness, or absorption behavior) can be provided for the following arrangement step. This allows an optimized and flexible adaptation of the manufacturing to the desired specifications. Furthermore, during a production of the reinforcing element, before the arrangement step, the region of the first substrate which is not brought into contact with or connected to the reinforcing element is subjected to a lesser extent to aggressive media, for example, etching solutions, so that this region can be preserved better for later contacting and/or connecting steps or whereby the preferably high surface properties of this region may be maintained better, respectively.

In a further preferred embodiment, the at least one reinforcing element, in particular the surface region(s) of the reinforcing element which is/are brought into contact with the first substrate during the method according to the invention, has an RMS surface roughness less than or equal to 25 nm, preferably less than or equal to 15 nm, particularly preferably less than or equal to 5 nm, and/or a flatness deviation less than or equal to 180 nm, in particular less than or equal to 110 nm.

Due to a high surface quality (for example, slight roughness, slight flatness deviation) of the reinforcing element, a high surface quality of the first substrate can be preserved or the high surface quality of the reinforcing element can be transferred in the course of the heating and deforming to the first substrate, to ensure a high surface quality of the optical component to be produced, respectively.

Furthermore, by arranging, in particular applying, the at least one reinforcing element on the first substrate, a stack is generated, whereby the reinforcing element covers or conceals a region of the first substrate. This stack made of first substrate and reinforcing element is referred to as the "base stack" hereafter.

The statement that a first layer, a first region, or a first device is arranged or applied "on" a second layer, a second region, or a second device can mean here and hereafter in this case that the first layer, the first region, or the first device is arranged or applied directly in direct mechanical and/or electrical contact on the second layer, the second region, or the second device. Furthermore, an indirect contact may also be referred to, in which further layers, regions, and/or devices are arranged between the first layer, the first region, or the first device and the second layer, the second region, or the second device.

The arrangement of the reinforcing element on the first substrate can be performed, for example, using a vacuum handler (vacuum suction unit), a gripper (collet), or a pickup tool (combination of vacuum suction unit and gripper), which ensure an exactly-positioned and precise arrangement of the reinforcing element on the first substrate. In this case, the reinforcing element is arranged or applied on the first substrate such that a deformation of the region of the first substrate functioning as an optical window, for example, is reduced or prevented. This is achieved in particular in that at least a part of the reinforcing element covers or conceals a region of the first substrate, which functions later as an optical window or as part of an optical window, for example.

This covered region of the first substrate extends in the scope of the invention on the region of the first substrate which lies between or on the contact surface or boundary surface, respectively, which exists between the reinforcing element and the first substrate, and the parallel projection of this contact surface on the opposing substrate side of the first substrate, wherein the connecting vector between a point of the contact surface and its image on the opposing substrate side of the first substrate is parallel to the resulting normal vector of the contact surface, wherein the resulting normal vector of the contact surface is ascertained by vector addition of the normal unit vectors of the infinitesimal partial surfaces of the contact surface which point in the direction of the first substrate. The surface regions of the first substrate which have shared points with the contact surface or its image, respectively, belong to the covered region of the first substrate.

The definition of the covered region of the first substrate is based on a stack (base stack/further base stack) as is provided before the deformation according to the method according to the invention of the first substrate.

The additional material of the reinforcing element stabilizes and protects the covered region of the first substrate and acts against a deformation. The high level of flatness, plane-parallelism, and slight surface roughness preferably present in the provided first substrate may thus be maintained, which is the basis for high-quality optical components, and in addition surfaces—in particular transmission surfaces which are not accessible to subsequent processing (for example, a polishing step), may be implemented with a high surface quality.

During the arrangement or application of the at least one reinforcing element on the first substrate, the first substrate and the reinforcing element are connected to one another, preferably in a form-fitted and/or integrally joined manner, in particular by gluing, soldering, or bonding, to ensure a high position stability of the reinforcing element in relation to the first substrate. The arrangement of the reinforcing element on the first substrate is expediently performed such that displacing and/or twisting of the reinforcing element in relation to the first substrate is reduced or prevented.

In a preferred embodiment, a form-fitted connection is implemented in that the reinforcing element is arranged in an alignment depression of the first substrate, which is implemented for the accommodation of the reinforcing element. In this type of the arrangement, no additional connecting substances (for example, adhesive) or special connecting steps (for example, bonding), respectively, are necessary, which could impair the surface quality of the first substrate.

In a further preferred embodiment, the at least one reinforcing element, for example, a silicon chip, is arranged on the first substrate or connected thereto, respectively, by anodic bonding, direct bonding, plasma-activated bonding, and/or thermal bonding. Above all in the semiconductor industry, these bonding methods are frequently used connection technologies, which result in stable connections. Such a connecting step, for example, the bonding, is preferably performed in vacuum, whereby, for example, air inclusions and/or included particles may be avoided in the connecting regions, in particular at the boundary surface between reinforcing element and first substrate, and defects thus resulting on the surface of the first substrate and therefore on the surface of the optical component may be reduced.

In a special embodiment of the method according to the invention as claimed in claim 1, the at least one reinforcing element is arranged on a positioning means before the arrangement on the first substrate. The equipping of the positioning means with the reinforcing element, i.e., the transfer and arrangement of the reinforcing element, can be performed, for example, using a vacuum handler (vacuum suction unit), a gripper (collet), or a pickup tool (combination of vacuum suction unit and collet), which ensure exactly-positioned and precise equipping on the positioning means.

All means, devices, and tools which stabilize the reinforcing element and/or hold it aligned in its location are suitable as positioning means. The handling of the reinforcing element in relation to the further method steps is made substantially easier by this stabilization. Thus, for example, the equipping can be performed under clean room conditions at atmospheric air pressure and a subsequent connecting step, for example, the anodic bonding, can be performed in another clean room region in vacuum.

For example, adhesive substrates based on magnetic or electrostatic force action or substrates which can ensure friction-locked (layer increasing friction), integrally joined (for example, applied adhesive layer), or form-fitted connections (for example, depressions or recesses) are suitable as positioning means.

In view of a subsequent connecting step (for example, anodic bonding), the positioning means is preferably embodied as electrically conductive. The positioning means accordingly preferably contains or consists of electrically conductive and/or semiconductive materials, for example, silicon.

A receptacle substrate can be used as a preferred positioning means. Such a receptacle substrate has at least one recess or depression (receptacle depression), which is designed to accommodate the reinforcing element and in particular holds it in a laterally fixed or aligned manner. Since the alignment of the reinforcing element is primarily ensured in this case by a form-fitted connection between receptacle substrate and reinforcing element, the receptacle substrate can be removed after the arrangement of the reinforcing element on the first substrate by canceling out the form fit in a simple manner, to release the base stack thus generated, made of first substrate and reinforcing element, for further process steps. The receptacle substrate may then be reused for the next equipping operation and is thus usable multiple times, whereby a reduction of the manufacturing outlay and the manufacturing costs is in turn provided.

To prevent the contact of the receptacle substrate with the first substrate during the arrangement of the reinforcing element on the first substrate and thus to preserve, for further connecting and/or contacting steps, the surface quality of the first substrate in the regions which are not to be brought into contact or connected to the reinforcing element, or to be able to ensure the removal with the fewest possible problems of the receptacle substrate after the arrangement of the reinforcing element on the first substrate, the receptacle depression is preferably designed such that at least one of the reinforcing elements protrudes beyond the delimitation surfaces of the receptacle substrate after arrangement on the receptacle substrate. All reinforcing elements particularly preferably protrude beyond the delimitation surfaces of the receptacle substrate after arrangement on the receptacle substrate.

The at least one reinforcing element can preferably have at least one fixing element or can have a mutual operational relationship (for example, mechanical, electrostatic, and/or magnetic force coupling) with at least one fixing element. The fixing element reduces or prevents, in particular after the base stack is brought into contact with the at least one second substrate, displacement and/or twisting of the reinforcing element in relation to the first substrate and therefore increases the position stability of the reinforcing element.

The reinforcing element and the fixing element are preferably mechanically connected to one another, to be able to ensure the most stable possible force coupling. The fixing element is preferably clamped between the base stack and the second substrate in the method step of bringing the base stack into contact with the second substrate. An expedient contact between base stack and second substrate may be ensured by suitable receptacle grooves—for example, in the second substrate, in spite of the interposed or clamped fixing element.

In a further preferred embodiment, the fixing element is connected in an integrally joined manner, in particular by means of thermal or anodic bonding, to the first substrate during the method step of the arrangement of the reinforcing element on the first substrate, whereby a particularly stable connection and therefore particularly good position stability of the reinforcing element can be ensured.

In a special embodiment of the invention, at least a part of the fixing element is in contact or is connected to a region of the first substrate, which lies outside the deflection region or in the support region after the base stack is brought into contact with the second substrate. Since this region of the first substrate is not subjected to deflection or deformation, it promotes improved force absorption and therefore an increased position stability of the reinforcing element.

The fixing element is preferably generated during the production of the reinforcing element, whereby additional manufacturing steps may be saved.

In a further preferred embodiment, one or more support structures are generated, wherein the generation of the support structure is performed such that the support structure protects the support region, in particular the support surface, of the first substrate and/or functions as a spacer between the first substrate and the second substrate.

The support region is the region of the first substrate which does not experience deflection, in particular not by deformation, or is directly or indirectly supported by the second substrate during the method. A direct support is provided if the first substrate and the second substrate are brought into contact with one another. In the case of an indirect support, for example, one or more layers or layer sequences are arranged between the first substrate and the second substrate. The support surface is the surface of the support region which faces toward the second substrate. In the case of a cover to be produced, for example, the support surface of the first substrate preferably forms the contact surface of the cover and therefore the surface of the cover which is provided for the contact or the connection of the cover to the carrier substrate. The contact surface of the cover and/or the surface of the first substrate opposite the contact surface on the other substrate side preferably lie in at least one of the substrate planes of the first substrate. The carrier substrate plane and the substrate planes of the first substrate are accordingly preferably arranged in parallel after the connection of the cover to the carrier substrate.

Due to the arrangement of the support structure on the first substrate, the preferably high surface quality of the first substrate can be preserved or one or more high-quality surface regions of the support structure can be molded on the first substrate during the method step of heating and deforming and thus one or more support regions, in particular support surfaces and therefore potential contact surfaces of the optical component to be produced, can be implemented with high surface quality. Such high-quality surface regions having slight roughness and a high level of flatness, for example, allow the use of mature connection technologies, for example, anodic bonding, using which stable connections may be produced between the optical component, for example, a cover, and the carrier substrate.

The support structure is preferably implemented by at least one layer or layer sequence which is applied or arranged on the first substrate. The distance between the first substrate and the second substrate may be set by the variation of the layer thickness of the layer(s), so that the support structure preferably functions as a spacer. A flexible adaptation of the method to implement different deformation-related deflection amplitudes of the first substrate or first depressions of different depths in the first substrate is thus made possible.

The at least one support structure is preferably produced like the at least one reinforcing element before the arrangement on the first substrate, whereby the provision of support structures and reinforcing elements having different dimensions and shapes is made possible, which can be combined in an arbitrary manner upon the arrangement on the first substrate. The production, positioning, or arrangement on the first substrate and a preferred connection to the first substrate can be performed in such a manner as was described above and will be described hereafter with reference to the reinforcing elements. This allows time-optimized and cost-optimized manufacturing. Alternatively, the support structure can be implemented, for example, by a layer which is applied to the first substrate, in particular deposited, and structured.

Respectively at least one reinforcing element is preferably arranged on both substrate sides of the first substrate, wherein opposing reinforcing elements preferably at least partially overlap. In a particularly advantageous embodiment, such reinforcing elements overlap completely (FIG. 3c). The regions of the first substrate covered thereby are thus particularly well stabilized and protected from deformation.

The at least one reinforcing element is preferably arranged on the first substrate so that an inclination of the region of the first substrate covered by this reinforcing element is assisted during the heating and deforming. This is achieved in particular in that at least one of the reinforcing elements is arranged non-centrally in the deflection region of the first substrate. The deflection region is the region of the first substrate, which is located between the support regions, and which is not supported, in particular not supported by the second substrate, in particular during the heating and deforming. A deflection region may be divided into the region of the first substrate covered by the reinforcing element and the deformation region of the first substrate. The deformation region in turn represents the region of the first substrate which, due to its shape change, ensures a deflection, in particular a displacement and/or inclination, of the region of the first substrate covered by the reinforcing element. Due to a non-central arrangement of the reinforcing element in the deflection region, in the event of equal distribution of the force over the deflection region, in particular over the reinforcing element, a resulting torque may be achieved which acts on the region of the first substrate covered by the reinforcing element and therefore promotes inclination of the region of the first substrate covered by the reinforcing element.

A non-central arrangement of a reinforcing element in the deflection region is understood in the meaning of the invention to mean that the distance of the reinforcing element in at least one direction is not of equal size to all support regions adjoining the deflection region. Correspondingly, for a non-central force on the deflection region, the distance of the engagement point of the resulting force is not of equal size in at least one direction to all support regions adjoining the deflection region. In the case of a non-central resulting force on a reinforcing element, the distance of the engagement point to the edges of the reinforcing element is not of equal size in at least one direction.

In a further method step, the base stack is brought into contact with the second substrate, to support the first substrate in the support region and ensure a stable force absorption in this region. In addition, the second substrate and/or the reinforcing element can be used as a deflection delimitation.

The bringing into contact of the base stack with the second substrate is preferably performed such that at least one cavity is formed between the second substrate and the base stack by a preferably implemented third depression in the second substrate and/or a preferably implemented first depression in the first substrate and/or by the support structure. In a particularly preferred embodiment, this cavity encloses at least one reinforcing element.

Due to the cavity, a direct or indirect contact (for example, caused by one or more interposed reinforcing elements) between the deflection region of the first substrate and the second substrate can be prevented before the heating and deforming. Such a contact could result in adhesion of the deflection region of the first substrate on the second substrate, for example, also indirectly by adhesion of the reinforcing element, which is arranged on the first substrate, on the second substrate, and prevent or make more difficult a deformation-related deflection of the first substrate in the deflection region, in particular a displacement and/or inclination of the region of the first substrate covered by the reinforcing element.

Furthermore, a pressure less than or greater than the ambient pressure, in particular the atmospheric air pressure, can be generated in the cavity. Since the cavity is delimited at least by a part of the deflection region of the first substrate, a pressure generated in the cavity, which is less than or greater than the ambient pressure, permits force effects to be generated to promote the deformation process.

The ambient pressure preferably corresponds to the atmospheric pressure, and the pressure values in the cavity are then preferably between approximately 750 mbar and approximately 900 mbar, or between approximately 1200 mbar and approximately 1350 mbar, and can be generated by means of a vacuum pump or pump, for example.

Furthermore, it can be advantageous if the bringing into contact of the second substrate with the base stack results in a connection, in particular an integrally joined connection. A cavity, which is preferably closed-off hermetically sealed from the environment, may thus be generated between the base stack and the second substrate.

In that the connection process is carried out at specific pressures, specific pressure values can be generated in the cavities. The pressure values during the connection process, for example, the anodic bonding at 400° C., are preferably between approximately 500 mbar and approximately 600 mbar or between approximately 800 mbar and approximately 900 mbar. Since the subsequent heating process is typically performed at substantially higher temperatures than the connection process—the first substrate is preferably brought during the method step of heating and deforming to a temperature between approximately 750° C. and approximately 900° C.—pressures of approximately 750 mbar to approximately 900 mbar or approximately 1.200 mbar to 1.350 mbar result due to the higher temperature from the specified pressure ranges in the cavity. Since the cavity is preferably closed off hermetically sealed from the environment, these pressure values are maintained over a longer period of time and therefore in particular for the deforming or shaping without further energy supply, for example, to operate a vacuum pump or pump.

The connection between base stack and second substrate is preferably implemented by anodic bonding and/or thermal bonding.

During the shaping of the first substrate, in particular the flow properties of the first substrate, in particular as they exist close to and above the softening temperature (softening point) and/or the melting temperature, are utilized. The advantage of this type of the shaping, also referred to as glass flow, in relation to other shaping or embossing methods, for example, glass deep-drawing or glass embossing (for example, blank pressing) is above all that in particular optical components, for example, having substrate or wafer extensions, in particular substrate or wafer diameters greater than or equal to 80 mm, in particular greater than or equal to 150 mm, particularly preferably greater than or equal to 300 mm, may be implemented with high surface quality, in particular slight surface roughness, a high level of surface flatness, and a high level of plane-parallelism of the surfaces of the substrate sides.

In particular if the starting substrate consists of glass, the surface roughness of the optical components is frequently not satisfactory. The molded substrates are roughened, for example, during the glass deep-drawing, and cannot meet the requirements for an optical window, for example.

In the case of blank pressing, the maximum extensions or dimensions of the producible optical components are greatly limited. Furthermore, in this embossing method, very high-quality, durable, and therefore costly embossing tools are necessary, which restricts flexible manufacturing.

The method step of heating and deforming of the first substrate is performed such that at least a part of the region of the first substrate covered by the at least one reinforcing element is displaced and/or inclined, and/or a region of the first substrate is brought into contact with the at least one reinforcing element.

At least the deformation region of the first substrate, preferably the deflection region, particularly preferably the entire first substrate, is brought to a temperature in this case which is preferably between the softening temperature minus 150° C. and the softening temperature plus 100° C. of the material of the first substrate, preferably the material of the deflection region, in particular the material of the deformation region, preferably between approximately 750° C. and approximately 900° C. In the range of the softening temperature, the corresponding material has particularly favorable deformation properties, in particular with respect to viscosity. Upon the use of borosilicate glass, having a softening temperature of approximately 820° C., for example, temperatures between approximately 750° C. and approximately 900° C. are expedient.

The softening temperature or the softening point, also called the Littleton temperature or Littleton point, is determined according to a method of Littleton. In this case, a material thread (for example, a glass thread) having a diameter of 0.65 mm to 1.0 mm and a length of 22.9 cm is suspended in a furnace of specific construction. At a heating speed of 5 to 10 K/minute, the lower end of the thread hanging out of the furnace is observed. With rising temperature, the thread lengthens under its own weight. The temperature at which the lengthening is 1 mm/minute is referred to as the Littleton temperature. Most glasses or glasslike materials have at this temperature a viscosity of approximately $10^{-7.6}$ dPa·s (Scholze, Horst "GlasS—Natur, Struktur und Eigenschaften [Glass—Nature, Structure, and Properties]", third edition, Springer Verlag, page 151).

During the heating and deforming, the first substrate is deformed by a force or force action on the first substrate, in particular the deflection region, in the deflection region, in particular in the deformation region.

In particular the deformation of the deformation region allows a displacement and/or inclination of at least a part of the covered region of the first substrate formed during the generation of the base stack, which is stabilized or protected from deformation by the reinforcing element.

If not only the deformation region but rather also the covered region of the first substrate is to be at least partially heated, a high-quality surface region of the reinforcing element having slight roughness and flatness deviation, for example, can thus be molded on the surface of the first substrate by the contact with the first substrate in the covered region. As a result, an optically high-quality surface region results in the first substrate therefrom. This has the advantage that the requirements for the surface quality of the corresponding substrate side(s) of the provided first substrate can be less and therefore a possibly required processing step, for example, the polishing, can be omitted, whereby the manufacturing costs may be reduced.

During the heating and deforming of the first substrate such that a region of the first substrate is brought into contact with the reinforcing element, at least a part of the reinforcing element is arranged spaced apart from the first substrate (for example, FIG. 7.1). Due to the heating and deforming, a region of the first substrate is brought into contact with the reinforcing element, in particular the part of the reinforcing element arranged spaced apart. In this case, the surface region of the reinforcing element brought into contact with the first substrate, which in particular has a slight roughness and flatness deviation, is preferably molded onto the first substrate and a high-quality optical region is thus generated in the first substrate. This in turn has the advantage that the requirements for the surface quality of the corresponding substrate side(s) of the provided first substrate can be less and therefore a possibly required processing step, for example, the polishing, can be omitted. At least partial regions of the regions of the first substrate and the reinforcing element brought into contact with one another by the heating and deforming are preferably connected to one another, in particular connected in an integrally joined manner. Such a connection is achieved in particular by thermal bonding. Particularly effective molding of the surface region or the surface structure of the reinforcing element on the first substrate is thus ensured.

In this case, the deflection region is frequently identical to the deformation region of the first substrate. In a special embodiment, the deflection region can consist of the deformation region and a region of the first substrate which is not provided for the deformation. In this case, by way of local heating of the deformation region, a deflection of the region of the first substrate not provided for the deformation and therefore bringing into contact of this region of the first substrate with the reinforcing element is ensured. As a result, a displaced and/or inclined region results in the first substrate.

The method step of heating and deforming is preferably carried out in a time-controlled manner or until the contact of the first substrate and/or the reinforcing element with a deflection delimitation, which delimits the maximum desired deformation-related deflection, for example. For example, a reinforcing element and/or the second substrate, in particular the base surface of the third depression, can be used as the deflection delimitation.

The deformation of the first substrate, in particular of the deformation region, can preferably be caused by the intrinsic weight force of the reinforcing element and/or the first substrate, in particular of the region of the first substrate covered by the reinforcing element, and/or by an externally introduced force.

An externally introduced force can expediently be based on a mechanical, for example, pneumatic, and/or magnetic and/or electrical and/or piezo-electrical interaction.

In a preferred embodiment, the externally introduced force is caused by a pressure difference between the two substrate sides of the first substrate, in particular in the deflection region. As in the case of the deformation by the intrinsic weight force, also in the case of this method of the force introduction, the first substrate or the base stack does not have to be brought into contact with a further object, for example, an embossing tool, whereby a quality reduction of the surfaces of the first substrate or functional reinforcing elements—which have to fulfill a function within the optical component after finishing, for example—is prevented.

In addition, in this case the heating and deforming can be carried out until a volume change of the cavity, which is caused by the shaping of the first substrate, results in a pressure in the cavity which corresponds to the ambient pressure.

Specially designed shaping devices are also suitable for the introduction of a force.

The introduced force can act both centrally and also non-centrally in relation to the reinforcing element and/or the deflection region. For example, a central force in relation to the deflection region results from a force profile equally distributed over the deflection region, whereby a displacement of the covered region of the first substrate can be achieved in the case of central arrangement of the reinforcing element in the deflection region. An inclination of the region of the first substrate covered by the reinforcing element can be achieved in this case by a non-central arrangement of the reinforcing element in the deflection region (for example, FIG. 3d).

In the case of a central arrangement of the reinforcing element in the deflection region, an inclination of the region of the first substrate covered by the reinforcing element can be achieved by a non-central force in relation to the reinforcing element. Both a non-central arrangement of the reinforcing element and also a non-central force in relation to the reinforcing element are particularly advantageous and effective for ensuring an inclination. In addition, an inclination of the first substrate or the region of the first substrate covered by the reinforcing element can be caused by an inclined region in the second substrate (for example, FIGS. 6-6.1).

To be able to ensure a deformation-related deflection with as few problems as possible, preferably a direct or indirect contact (for example, caused by one or more interposed reinforcing elements), which could result in adhesion, is to be prevented between the deflection region of the first substrate and the second substrate before the heating and deforming.

To reduce the adhesive forces in the case of a contact, the surfaces or specific surface regions of the reinforcing element, the first substrate, and/or the second substrate are preferably prepared such that a connection between the deflection region of the first substrate and the second substrate is prevented. This may be implemented by various coatings and/or methods for surface modification, which contribute to the reduction of the contact forces. Suitable coating materials are, for example, platinum, NiAl alloy (for example, an alloy made of 50% nickel and 50% aluminum), graphite, and boron nitride.

The method according to the invention as claimed in claim 2 represents an alternative to the method according to the invention as claimed in claim 1, and is also used for producing optical components and has the following steps:
providing a first substrate and a second substrate,
providing at least one reinforcing element by detaching it from a reinforcing substrate,
generating a stack by arranging the at least one reinforcing element on the second substrate,
bringing the first substrate into contact with the stack,
heating and deforming the first substrate such that a region of the first substrate is brought into contact with the at least one reinforcing element.

The previous statements on the first two method steps—providing a first and a second substrate and providing at least one reinforcing element—of the method according to the invention as claimed in claim 1 apply equivalently for the first two method steps of the method according to the invention as claimed in claim 2.

The stack made of reinforcing element and second substrate is referred to hereafter as a "main stack".

In an advantageous embodiment of the method according to the invention as claimed in claim 2, the provided first substrate has at least one further reinforcing element, wherein the further reinforcing element covers a region of the first substrate (covered region) and the first substrate and the further reinforcing element form a further stack (further base stack), which is brought into contact with the main stack during the step of bringing into contact, and wherein the heating and deforming of the first substrate are additionally performed such that at least a part of the region of the first substrate covered by the further reinforcing element is displaced and/or inclined (for example, FIG. 6.3), and/or that a region of the first substrate is brought into contact with the further reinforcing element (for example, FIG. 8.4). One advantage of this embodiment is in particular that the first substrate does not have to be turned over during the method and nonetheless a support (for example, stabilizing, molding) of both substrate sides of the first substrate by reinforcing elements is ensured. This is significant, for example, if the reinforcing element is arranged on the first substrate in a form-fitted manner, for example, in an alignment depression.

The previous statements on the reinforcing element and on the base stack of the method according to the invention as claimed in claim 1 apply equivalently for the further reinforcing element and the further stack (further base stack) generated by its arrangement on the first substrate.

For example, the further reinforcing element can be arranged on the substrate side of the first substrate facing away from the second substrate after the further base stack is brought into contact with the main stack, and the at least one reinforcing element is arranged on the second substrate. For example, the region of the first substrate covered by the further reinforcing element is inclined and/or displaced by the step of heating and deforming, and the surface region of the covered region of the first substrate which faces toward the second substrate is brought into contact with the at least one reinforcing element, so that as a result, a region of the first substrate supported on both sides by reinforcing elements can be generated (for example, FIG. 6.3). High-quality surfaces of the covered region of the first substrate may thus be implemented on both substrate sides.

Furthermore, a region of the first substrate which lies outside the region of the first substrate covered by the further reinforcing element can be brought into contact with the at least one reinforcing element by the method step of heating and deforming, while the region of the first substrate covered by the further reinforcing element is inclined and/or displaced (for example, FIG. 8.2*a*). Multiple optical regions, for example, multiple optical windows, may thus be produced by the same step of heating and deforming.

In a further preferred embodiment of the method according to the invention as claimed in claim 2, the provision of the first substrate with the further reinforcing element is performed such that the further reinforcing element is provided by detaching it from a reinforcing substrate and is arranged on the first substrate and/or a reinforcing layer is applied to the first substrate, which is structured to generate the further reinforcing element.

With respect to the provision of the further reinforcing element by detaching it from a reinforcing substrate and its arrangement on the first substrate, reference is again made to the statements on the method according to the invention as claimed in claim 1, which apply equivalently for this embodiment as claimed in claim 2.

Alternatively, the first substrate having the further reinforcing element, corresponding to the further base stack, can be generated by applying at least one reinforcing layer to the first substrate and structuring this reinforcing layer to implement the further reinforcing element.

For example, the reinforcing layer can be applied by means of deposition methods to the first substrate and/or the reinforcing layer is implemented by the use of at least one further substrate.

The reinforcing layer, in particular the further reinforcing element, preferably consists of a semiconductive material or preferably contains a semiconductive material at least in partial regions. Silicon layers, in particular polysilicon layers, and/or as a further substrate, a semiconductor wafer, preferably a silicon wafer, are particularly preferably used to be able to use the mature and well-controllable processes of semiconductor technology, in particular silicon technology.

During the application of the reinforcing layer to the first substrate, the first substrate and the reinforcing layer are preferably connected to one another in an integrally joined manner, to ensure a high position stability of the reinforcing layer in relation to the first substrate. In general, all expedient technologies are usable for this purpose, for example, deposition, gluing, soldering, or bonding. The application of the reinforcing layer on the first substrate is expediently performed such that displacement and/or twisting of the reinforcing layer in relation to the first substrate is reduced or prevented.

Preferably, a polysilicon layer is applied as a reinforcing layer to the first substrate by means of CVD, in particular hot-wire CVD or PECVD, or PVD (for example, sputtering). Since the process temperatures in these deposition methods are less than 600° C., preferably between 400° C. and 500° C., more temperature-sensitive substrates may also be coated thereby.

Furthermore, the reinforcing layer, for example, a silicon wafer, can be applied to the first substrate or connected thereto by anodic bonding and/or thermal bonding. Above all in the semiconductor industry, these bonding methods are frequently used connection technologies, which result in stable connections.

The reinforcing layer preferably has at least one second depression, at least on the layer side which is brought into connection with the first substrate. This second depression is to prevent a contact between the first substrate and the reinforcing layer in specific regions of the first substrate during the arrangement/application, to preserve the surface quality of the first substrate in these regions for further connecting and/or contacting steps. Such regions to be preserved are in particular the regions of the first substrate which are not provided with the reinforcing element or are not brought into contact with the reinforcing element. The second depressions in the at least one reinforcing layer preferably have depths of approximately 0.5 μm to approximately 1 μm.

The structuring of the reinforcing layer to generate at least one further reinforcing element is performed such that a deformation of the regions of the first substrate functioning as optical windows, for example, is reduced or prevented. This is achieved in particular in that the reinforcing layer at least partially covers or conceals the regions of the first substrate functioning as optical windows, for example. The regions of the reinforcing layer which do not function as reinforcing elements may be removed, for example, by means of wet-chemical and/or dry-chemical etching methods. The additional material of the further reinforcing elements stabilizes and protects the covered regions of the first substrate and acts against a deformation. The high level of flatness, plane-parallelism, and slight surface roughness present preferably in the provided first substrate may thus be maintained, which is the basis for high-quality optical windows, and in addition surfaces, in particular transmission surfaces, which are not accessible to subsequent processing (for example, a polishing step), having a high surface quality may be implemented.

In a further method step of the method according to the invention as claimed in claim 2, a stack (main stack) is generated by arranging the at least one reinforcing element on the second substrate.

The arrangement of the reinforcing element on the second substrate can be performed, for example, using a vacuum handler (vacuum suction unit), a gripper (collet), or a pickup tool (combination of vacuum suction unit and gripper), which ensure an exactly-positioned and precise arrangement of the reinforcing element on the second substrate. By arranging the reinforcing element on the second substrate, the first substrate is not subjected to any process steps linked to the arrangement (for example, depositing, etching, connecting processes), which can influence the surface and material quality of the first substrate, for example. In this case, the reinforcing element is preferably arranged on a surface region of the second substrate which faces toward the deflection region of the first substrate after the first substrate is brought into contact with the main stack. The reinforcing element is in particular arranged in a third depression, preferably on the base of the third depression, and/or in a feedthrough of the second substrate. Due to these embodiments, the bringing into contact of the first substrate with the reinforcing element in the course of the heating and deforming may be promoted. It is ensured by the reinforcing element, for example, that the deflection region of the first substrate, in particular the region for which a high optical surface quality is required, is not brought into contact with the second substrate. Accordingly, the surface quality of the surface region of the reinforcing element which is brought into contact by the heating and deforming with the first substrate is decisive for the generated surface quality in the deflection region, for example, in the region which is to function as an optical window. This has the advantage that lower requirements can be placed on the surface quality of the second substrate and the outlay for providing the second substrate can be reduced.

During the arrangement or application of the at least one reinforcing element on the second substrate, the second substrate and the reinforcing element are connected to one another, preferably in a form-fitted and/or integrally joined manner, in particular by gluing, soldering, or bonding, to ensure a high position stability of the reinforcing element in relation to the second substrate.

A form-fitted connection can be implemented in that the at least one reinforcing element is arranged in a preferably implemented alignment depression of the second substrate, which is implemented to accommodate the reinforcing element. In the case of this type of the arrangement, no additional connecting substances (for example, adhesive) or special connecting steps (for example, bonding) are required, which could impair the surface quality of the reinforcing element.

In a special embodiment of the method according to the invention as claimed in claim 2, the at least one reinforcing element is arranged on a positioning means, in particular a receptacle substrate, before the arrangement on the second substrate.

Reference is made to the equivalently applicable statements on the method according to the invention as claimed in claim 1 and the use of a positioning means or receptacle substrate to arrange the reinforcing element on the first substrate with reference to the effects and advantages connected to these embodiments or further design details, wherein the reference therein to the first substrate and the base stack is to be replaced by a reference to the second substrate and the main stack.

Preferably, the at least one reinforcing element can have at least one fixing element or can have a mutual operational relationship (for example, mechanical, electrostatic, and/or magnetic force coupling) with at least one fixing element. The fixing element reduces or prevents, in particular after the further base stack or the first substrate is brought into contact with the main stack, in particular the second substrate, displacement and/or twisting of the at least one reinforcing element in relation to the second substrate and therefore increases the position stability of the reinforcing element. The reinforcing element and the fixing element are preferably mechanically connected to one another, to be able to ensure the most stable possible force coupling.

The fixing element is preferably clamped between the further base stack or the first substrate and the main stack, in particular the second substrate, in the method step of bringing the further base stack or the first substrate into contact with the main stack. For example, an expedient contact between the further base stack or the first substrate and the main stack may be ensured in spite of the interposed or clamped fixing element by receptacle grooves—for example, in the first substrate.

In a further preferred embodiment, the fixing element is connected to the second substrate in an integrally joined manner, in particular by means of thermal or anodic bonding, during the method step of arranging the reinforcing element on the second substrate, whereby a particularly stable connection and therefore a particularly good position stability of the reinforcing element can be ensured.

In a preferred embodiment of the method according to the invention as claimed in claim 2, the reinforcing element is arranged on a surface region of the second substrate, which is implemented as inclined in relation to at least one substrate plane of the second substrate or to at least one substrate plane of the first substrate after the step of bringing the main stack into contact with the first substrate or the further base stack. An inclined region of the first substrate (for example, FIG. 6.1) supported by the reinforcing element may thus be generated by the step of heating and deforming. To increase the position stability of the reinforcing element on the second substrate, the inclined surface region of the second substrate preferably has an alignment depression.

In a further embodiment, the reinforcing element is implemented as wedge-shaped, to ensure an inclined surface to support the first substrate and therefore the generation of an inclined region in the first substrate on a non-inclined surface region of the second substrate after arrangement of the reinforcing element. The flexibility of the method may thus be increased, because, to implement regions in the first substrate inclined to different extents, reinforcing elements implemented as wedge-shaped to different extents must merely be provided and arranged on the second substrate. The second substrate can thus be used independently of the reinforcing elements used and does not have to be replaced by corresponding second substrates adapted to the requirements (required inclination).

In a further advantageous embodiment, at least one reinforcing element is arranged on both substrate sides of the second substrate, whereby the second substrate or the main stack thus generated can accommodate a first substrate or a further base stack or can be brought into contact therewith using each of its substrate sides. Two first substrates can thus be processed and/or heated and deformed in parallel, whereby a cost reduction can be achieved.

In a further method step of the method according to the invention as claimed in claim 2, the first substrate or the further base stack is brought into contact with the main stack, in order to support the first substrate in the support regions as described above and ensure a stable force absorption in these regions. In addition, the second substrate and/or the reinforcing element can be used as a deflection delimitation.

The previous statements on the method according to the invention as claimed in claim 1 with respect to the bringing into contact, in particular connecting, of the base stack with the second substrate apply equivalently in relation to the bringing into contact, in particular connecting, of the first substrate or the further base stack with the main stack, in particular the second substrate, according to the method according to the invention as claimed in claim 2, wherein in the case of this equivalent way of consideration, the base stack and the second substrate according to the method as claimed in claim 1 are to be replaced by the further base stack and the main stack according to the method as claimed in claim 2. Accordingly, the bringing into contact of the further base stack and the main stack is preferably performed such that a cavity is formed between the further base stack, in particular the first substrate, and the main stack, in particular the second substrate.

In a preferred embodiment, the generation of the main stack and the bringing into contact thereof with the first substrate or the further base stack is performed such that the at least one reinforcing element is at least partially arranged between the first and the second substrate, in particular at least partially on the substrate side of the second substrate facing toward the first substrate. The arrangement of the reinforcing element between the first and second substrates means according to the invention that the reinforcing element is arranged at least partially on the substrate side of the second substrate facing toward the first substrate and/or at least partially in a feedthrough or recess of the second substrate.

The reinforcing element may be positioned particularly advantageously in relation to the first substrate by such an arrangement, whereby the method becomes more flexible and less complex.

The reinforcing element is preferably not arranged on the substrate side of the second substrate facing away from the first substrate, which has the advantage, in conjunction with an arrangement of the reinforcing element on the substrate side of the second substrate facing toward the first substrate and/or in a feedthrough or recess of the second substrate, that in the case of a preferably provided connection of the reinforcing element to the first substrate, after the heating and deforming, it is possible to lift the first substrate and the reinforcing element connected thereto off of the second substrate, and thus no complex processes have to be carried out to remove the second substrate. The second substrate can then be reused without recycling measures, for example.

An arrangement of the reinforcing element between the first and second substrates can alternatively be performed during the method step of heating and deforming.

The previous statements on the method according to the invention as claimed in claim 1 with respect to the heating and deforming of the first substrate apply equivalently in relation to the heating and deforming of the first substrate according to the method according to the invention as claimed in claim 2, wherein in the case of this equivalent manner of consideration, the base stack or the reinforcing element according to the method as claimed in claim 1 are to be replaced by the further base stack or the further reinforcing element, respectively, according to the method as claimed in claim 3.

The method step of heating and deforming the first substrate is performed such that a region of the first substrate is brought into contact with the at least one reinforcing element, wherein at least a part of the reinforcing element is arranged spaced apart from the first substrate. A region of the first substrate is brought into contact with the reinforcing element, in particular the part of the reinforcing element arranged spaced apart, by the heating and deforming. In this case, the surface region of the reinforcing element brought into contact with the first substrate, which has, for example, a high surface quality having slight roughness and slight flatness deviation, is preferably molded on the first substrate and thus a high-quality optical region is generated in the first substrate. This in turn has the advantage that the requirements for the surface quality of the corresponding substrate side(s) of the provided first substrate can be lower and therefore a possibly required processing step, for example, the polishing, can be omitted.

In this case, the deflection region is frequently identical to the deformation region of the first substrate. In a special embodiment, the deflection region can consist of the deformation region and a region of the first substrate not provided for the deformation. In this case, by way of local heating of the deformation region, a deflection of the region of the first substrate not provided for the deformation and therefore bringing into contact of this region of the first substrate with the reinforcing element are ensured. As a result, a displaced and/or inclined region arises in the first substrate.

In a preferred embodiment, at least partial regions of the regions of the first substrate and the reinforcing element brought into contact with one another by the heating and deforming are connected to one another, in particular connected in an integrally joined manner. Such a connection is preferably achieved by thermal bonding. Particularly effective molding of the surface region or the surface structure of the reinforcing element on the first substrate is thus ensured and the reinforcing element can be removed together with the first substrate from the second substrate after the heating and deforming. After the removal of the reinforcing element from the first substrate, the reinforcing element and the second substrate can then preferably be reused.

In particular if the at least one reinforcing element, the at least one further reinforcing element, the at least one support structure, and/or the at least one fixing element, which are summarized hereafter under the term "auxiliary elements", do not have any further functions to fulfill, they are preferably at least partially, preferably completely, removed in a further method step.

The removal is particularly preferably performed such that at least one of the auxiliary elements can be reused and used multiple times, whereby the efficiency of the method is increased and the manufacturing outlay or the manufacturing costs may be reduced.

This may be implemented in particular in that at least one of the auxiliary elements, at least in the region(s) which is/are brought into connection with the first substrate, has a sacrificial layer, which is removed after the deformation of the first substrate to release the auxiliary element. Alternatively, the sacrificial layer can first be applied to the first substrate and structured, wherein the auxiliary elements are then arranged in a following method step on the sacrificial layer and therefore on the first substrate.

A preferred sacrificial layer contains or consists of silicon, germanium, zinc oxide, molybdenum, and/or tungsten. For such auxiliary elements connected via a sacrificial layer to the first substrate, materials, for example, high-melting point or high-temperature-resistant glasses (e.g., Corning Eagle XG®, Corning Lotus Glass®, Schott AF32®) can be used, which, in the case of a direct connection to the first substrate under the proviso that the first substrate or the finished component is not to be damaged, may only be removed with great effort.

However, it can be advantageous for specific applications for parts of the reinforcing element or the further reinforcing element to remain on the first substrate or the finished optical component, for example, as a frame-shaped stabilization structure or aperture structure.

The at least one second substrate is also preferably completely removed after the deformation. In some cases, however, the microsystems to be encapsulated are arranged on the second substrate, so that it can be entirely reasonable for the connection between base stack or further base stack and the main stack or the second substrate to remain in existence.

In one advantageous embodiment, at least partial regions of the first substrate are provided with at least one finishing coating—in particular with an antireflective coating, an antistatic coating, a reflective coating, and/or an absorption coating, and/or functional surface structures, whereby the functionality of the optical component may be improved.

Preferably used finishing coatings are antireflective coatings, which further reduce reflections on a cover, in particular on its optical windows, and therefore radiation losses, for example. Such antireflective coatings may be implemented, for example, by layer systems made of magnesium fluoride and titanium oxide, or silicon oxide and titanium oxide.

Furthermore, antistatic coatings, which minimize an electrical charge of the optical component, are used. A material which is particularly suitable for antistatic coatings in optical applications is ITO (indium-tin oxide), since it has a high electrical conductivity in doped form and has a high transparency over a broad wavelength range.

Furthermore, it can be advantageous if reflective coatings, for example, metal layers, are applied as finishing coatings, which form locally reflective regions after structuring, for example, to spatially delimit an incident light beam (aperture function) or to form a static deflection mirror in the vicinity of the optical windows.

Preferably used finishing coatings are furthermore absorption coatings, which absorb electromagnetic radiation of specific wavelengths or entire wavelength ranges.

Functional surface structures are, in the meaning of the invention, geometric modifications of the surface in the micrometer range and/or nanometer range, whereby specific surface properties can be influenced in a targeted manner. Thus, by way of the preferred use of moth-eye structures (see document D. G. Stavenga, S. Foletti, G. Palasantzas, K. Arikawa "Light on the moth-eye corneal nipple array of butterflies", Proceedings of the Royal Society B (2006) 273, 661-667, doi: 10.1098/rspb.2005.3369, published online 6 Dec. 2005), the structural dimensions of which are less than the wavelength of the radiation used in the application, the index of refraction of a boundary layer—for example, as exists between a glass surface and the air surrounding it—may be reduced, because of which moth-eye structures are suitable for antireflective treatment of surfaces. Such an antireflective treatment is advantageous in particular if a coating proves to be unsuitable for reasons of adhesion.

Moth-eye structures may be generated with the aid of embossing methods, for example, after the molding of the first substrate on the surfaces of the first substrate. The embossing of such structures in inclined and/or displaced surfaces is extraordinarily problematic, however. Moth-eye structures may be produced by utilizing the flow properties of the first substrate on inclined surfaces in particular.

Correspondingly, in one preferred embodiment, moth-eye structures are generated as functional surface structures such that, before the arrangement and/or the bringing into contact of the at least one reinforcing element and/or the further reinforcing element on/with the first substrate, at least the region of the at least one reinforcing element and/or the further reinforcing element, which is brought into contact with the first substrate, is provided with a negative mold of the moth-eye structures and, after the arrangement and/or the bringing into contact of the at least one reinforcing element and/or the further reinforcing element on/with the first substrate during the shaping of the first substrate, the moth-eye structures are generated on the first and/or second substrate side of the first substrate, in that the negative mold in the at least one reinforcing element and/or the further reinforcing element is molded on the first and/or second substrate side of the first substrate, in particular on the transmission surfaces of the optical windows. In this case, the first substrate flows into the cavities predefined by the negative mold in the at least one reinforcing element and/or the further reinforcing element, whereby the corresponding surface geometry results. The shaping of the first substrate and the generation of the moth-eye structures can also be performed at separate times or successively in independent steps.

In a further preferred embodiment, the finishing coating is generated such that, before the arrangement and/or the bringing into contact of the at least one reinforcing element and/or the further reinforcing element on/with the first substrate, at least the region of the at least one reinforcing element and/or the further reinforcing element, which is brought into contact with the first substrate, is provided with the finishing coating and subsequently a connection is produced between the first substrate and the at least one reinforcing element and/or the further reinforcing element by a connection between the finishing coating and the first substrate, or, before the arrangement and/or the bringing into contact of the at least one reinforcing element and/or the further reinforcing element on/with the first substrate, the finishing coating is applied to the first substrate and subsequently the at least one reinforcing element and/or the further reinforcing element is arranged and/or brought into contact on/with the finishing coating, wherein after the deformation step, the at least one reinforcing element and/or the further reinforcing element is at least partially removed and the finishing coating remains on the first substrate, in particular on the optical windows. With the application of the finishing coating on the first substrate before the deformation of the first substrate, a homogeneous finishing coating having small tolerances in the thickness of the individual layers of the finishing coating may be implemented in particular on inclined optical regions, for example, inclined optical windows. During the application of the finishing coating after the deformation of the first substrate, the deposition and possible structuring of the individual layers must be performed, for example, on inclined regions or surfaces, from which, in particular if anisotropic deposition methods are used, differences can result in the thicknesses of the individual layers and therefore location-dependent differences can result in the properties or in the optical functionality of the finishing coating and therefore of the optical component. A broadband antireflective coating produced according to this embodiment could be based on a layer sequence of silicon oxide and silicon nitride, for example. In this case, firstly the silicon oxide layer is applied to the reinforcing element, for example, made of silicon. Subsequently, the silicon nitride layer is applied to the silicon oxide layer. The layer sequence of reinforcing element, silicon oxide layer, and silicon nitride layer is then connected to the first substrate, in that the silicon nitride layer is brought into connection with the first substrate. After selective removal of the reinforcing element, a layer sequence of first substrate, silicon nitride layer, and silicon oxide layer, and therefore a first substrate provided with an antireflective coating, remains. Instead of silicon nitride, titanium dioxide can alternatively also be used.

Combinations of finishing coating and functional surface structures, for example, a combination of antistatic coating and moth-eye structures, can also cause improvements of the functionality of the optical component.

Without restriction of the generality, the invention will be described in greater detail hereafter on the basis of examples.

BRIEF DESCRIPTION OF THE DRAWINGS

FIGS. 3 and 3a-3g show the step sequence of a process variant to produce a cover 22 having inclined optical windows 8 according to the method according to the invention as claimed in claim 1.

FIGS. 5a-5e and 5.1a-d, 5.2a-c, 5.3a-d, 5.4a-h show the step sequence of further process variants to produce a cover 22 having displaced optical windows 30 according to the method according to the invention as claimed in claims 1-4.

FIGS. 6a-6e and 6.1a-g, 6.2a-f, 6.3a-i show the step sequence of further process variants to produce a cover 22 having optical windows 32, which are embodied as displaced and inclined, according to the method according to the invention as claimed in claims 1-4.

FIGS. 7a-7e and 7.1a-d, 7.2a-d, 7.3a-d show the step sequence of further process variants to produce a cover 22 having two inclined optical windows 8 in a deflection region 21 according to the method according to the invention as claimed in claims 1-3.

FIGS. 8a-8d and 8.1a-c, 8.2a-d, 8.3a-d, 8.4a-d show the step sequence of further process variants to produce a cover 22 having two inclined optical windows 8 and one displaced optical window 30 in a deflection region 21 according to the method according to the invention as claimed in claims 1-3.

FIGS. 9a-9c and 9.1a-d show the use of fixing elements 16.

DETAILED DESCRIPTION OF THE PREFERRED EMBODIMENTS

Figure 1A:
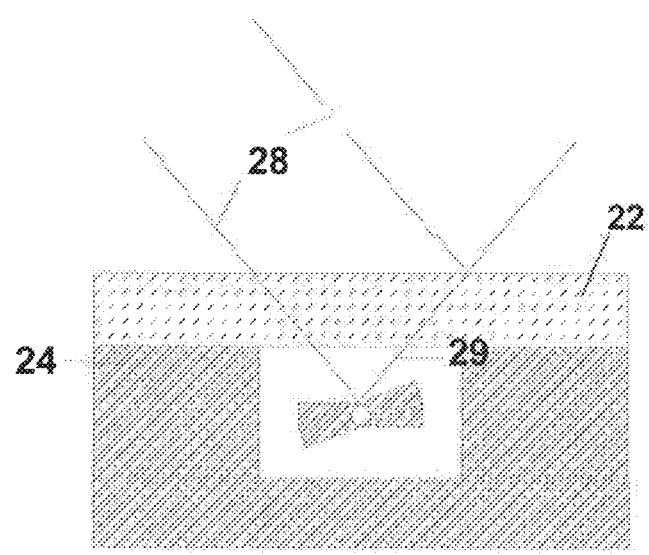
FIGS. 1a-1b show prior art covers for encapsulated microsystems.
Figure 1B:
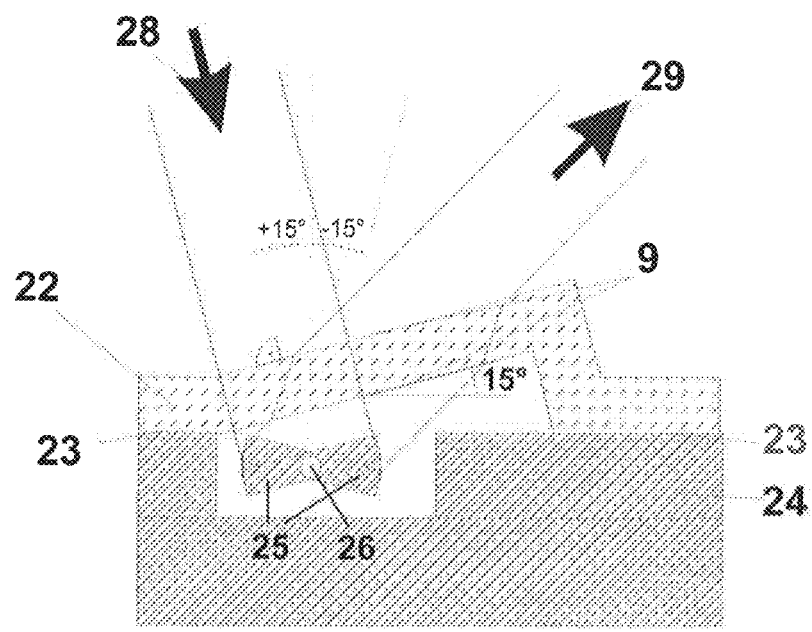
Figure 2A:
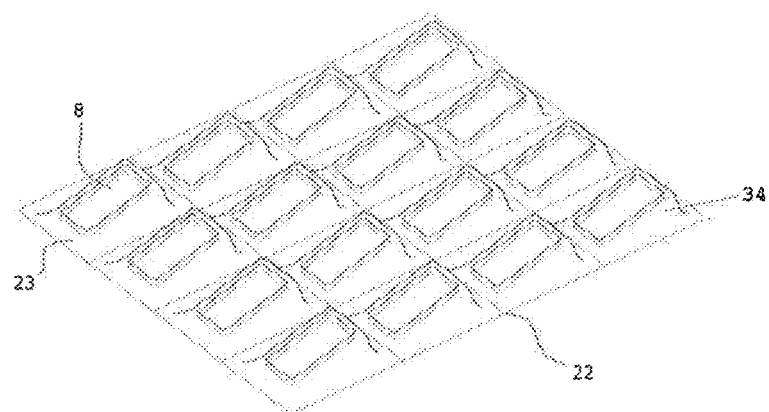
FIGS. 2a-2e show a cover 22 produced using the method according to the invention having inclined optical windows 8 and displaced optical windows 30 and the use thereof to encapsulate a micromirror 25.
Figure 2B:
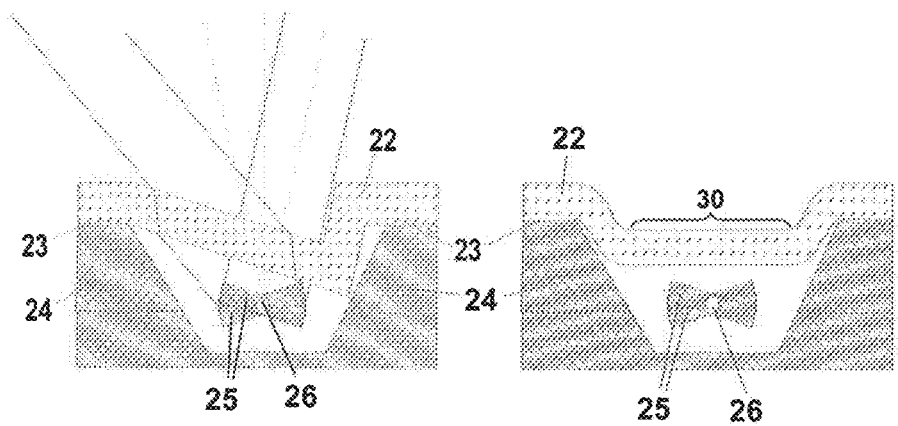
Figure 2C:
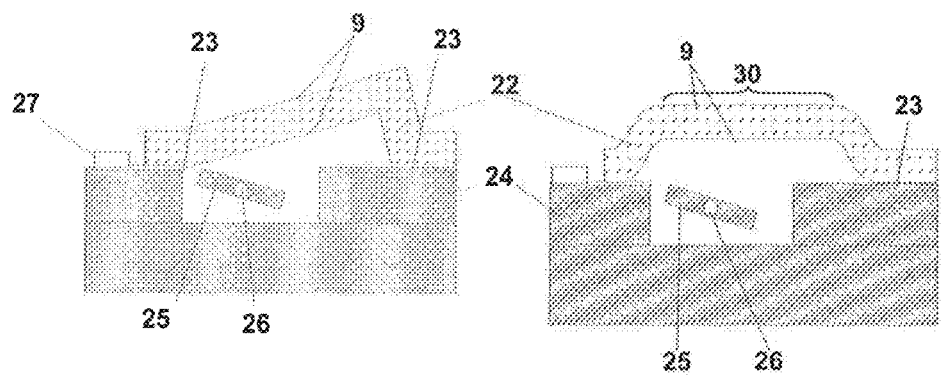
Figure 2D:
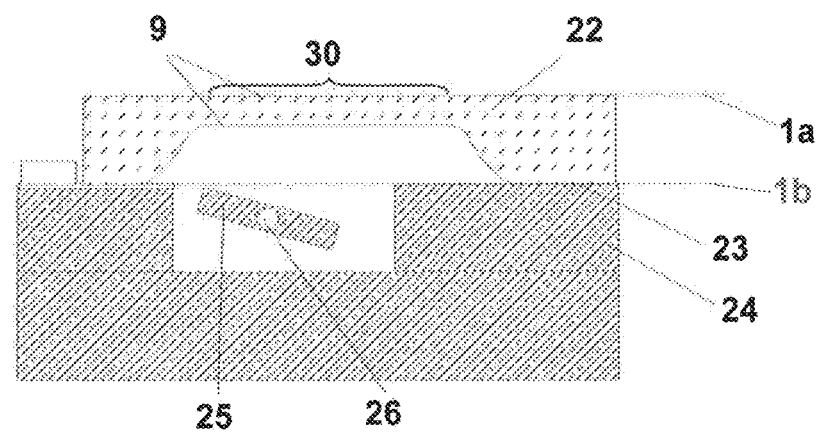
Figure 2E:
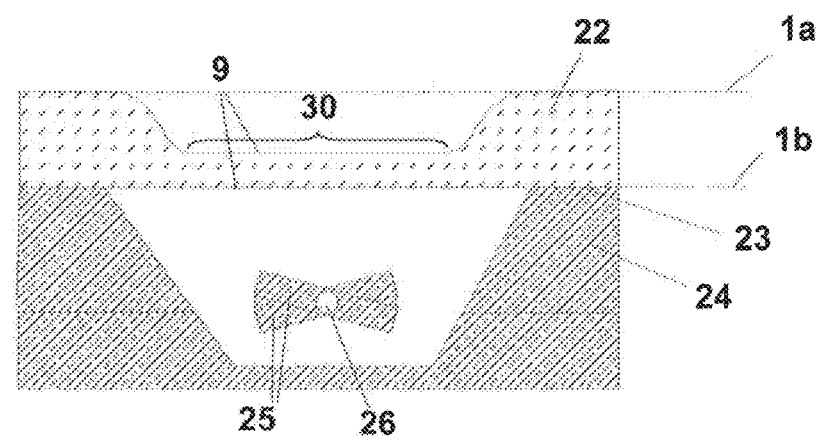

FIG. 2a shows a cover 22 produced using the method according to the invention having inclined optical windows 8 or the detail of a glass wafer structured or molded according to the method according to the invention, which can be used to encapsulate an entire silicon wafer. A glass wafer 1 made of borosilicate glass, which has flat, plane-parallel substrate planes 1a, 1b on both sides, forms the starting material. Both wafer sides or wafer planes 1a, 1b are embodied as polished, to achieve a slight surface roughness and therefore a high quality of the inclined optical windows 8. The inclined optical windows 8 are arranged in a two-dimensional array and typically have an inclination between approximately 5° and approximately 20°, preferably approximately 15°, in relation to the peripheral contact surfaces 23. The peripheral contact surfaces 23 are arranged closed in a frame shape around each inclined optical window 8 and are embodied as flat. Correspondingly dimensioned frame-shaped closed flat surfaces are provided on the carrier substrate or carrier wafer 24 as counter contact surfaces, so that a connection which is closed off hermetically sealed to the surroundings is made possible.

The inclined optical windows 8 are provided on both sides with an antireflective coating made of a layer system of silicon dioxide and titanium oxide.

FIGS. 2b-2e each show two usage variants of a cover 22 having inclined optical windows 8 and displaced optical windows 30 for encapsulating a micromirror 25.

Figure 3C:
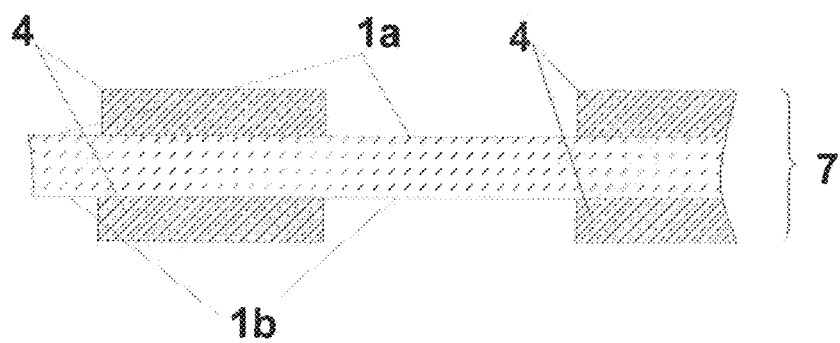
Figure 3D:
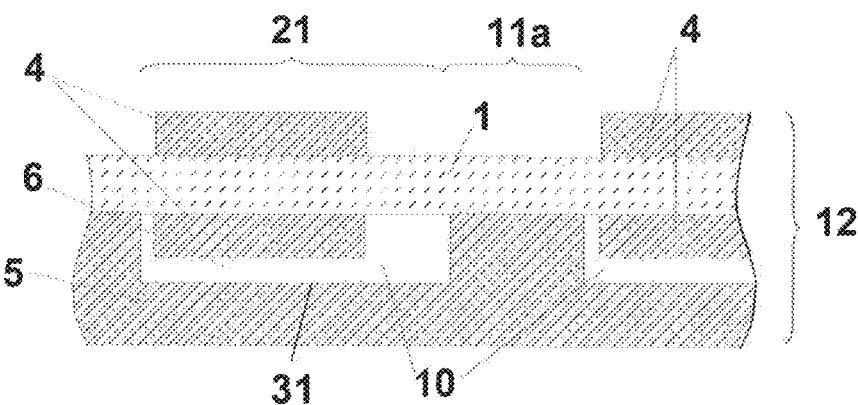
Figure 3E:
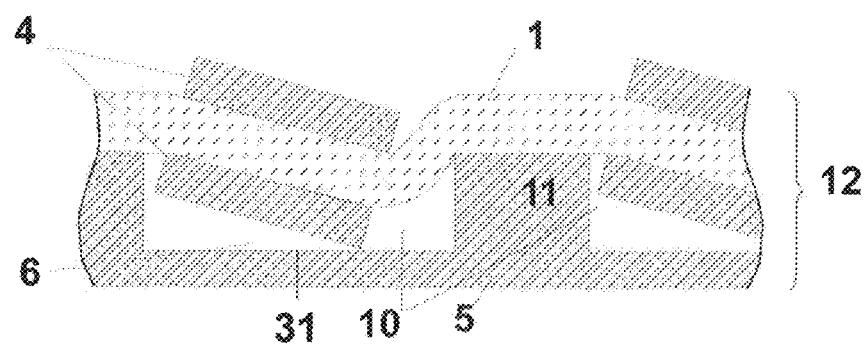
Figure 3F:
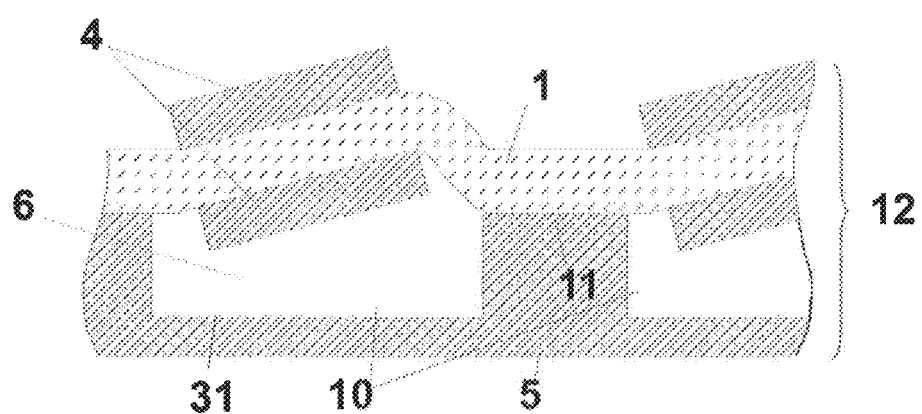
Figure 3G:
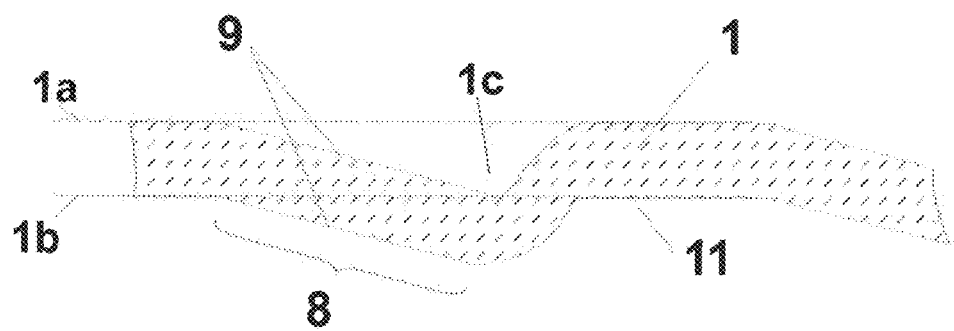

FIGS. 3-3g show the step sequence of a process variant to produce a cover 22 having inclined optical windows 8 according to the method according to the invention as claimed in claim 1. The first substrate 1 provided for the process beginning is a glass wafer made of borosilicate glass, which has flat, plane-parallel substrate planes 1a, 1b on both sides, and which preferably has a thickness between approximately 500 µm and approximately 1000 µm, in this case 725 µm. Both wafer sides or wafer planes 1a, 1b of the glass wafer 1 are polished and therefore have a high surface quality having an RMS surface roughness of approximately 25 nm.

Furthermore, reinforcing elements 4 made of silicon, which have been sawn out of a silicon wafer 4a (FIG. 3) are provided. The reinforcing elements 4 preferably have a thickness between approximately 100 µm and approximately 300 µm, in this case 200 µm, and are arranged or positioned by means of vacuum handler 3 on one of the substrate sides 1a, 1b of the glass wafer 1, whereby the base stack 7 results (FIG. 3a).

To increase the position stability of the reinforcing elements 4, the reinforcing elements 4 are connected by means of anodic bonding to the glass wafer 1. An equivalent method is used with the other substrate side 1a, 1b of the glass wafer 1, so that reinforcing elements 4, which are connected to the glass wafer 1, are arranged on both substrate sides 1a, 1b of the glass wafer 1.

To ensure a more stable arrangement of the reinforcing elements 4 on the glass wafer 1 before the connection, in a further variant, the reinforcing elements 4 can be transferred by means of vacuum handler 3 into a receptacle substrate 2 based on a silicon wafer, which has receptacle depressions 37 for accommodating the reinforcing elements 4. The receptacle depressions 37 in the receptacle substrate 2 are generated beforehand by means of dry-chemical etching methods and are left out such that the reinforcing elements 4 protrude beyond the delimitation surfaces 36 of the receptacle substrate 2 in their final position on the receptacle substrate 2 (FIG. 3b). Also in this case, firstly the one substrate side 1a, 1b of the glass wafer 1 is processed, i.e., the reinforcing elements 4 are arranged in the receptacle substrate 2 and then connected to the glass wafer 1 (FIG. 3b_1), and then the second substrate side 1a, 1b of the glass wafer 1 is processed in an equivalent manner. In this case, the base stack 7 resulting due to the processing of the first substrate side 1a, 1b of the glass wafer 1 is released by detaching the form-fitted connection between base stack 7 and receptacle substrate 2 (FIG. 3b_2); subsequently, the receptacle substrate 2 is again equipped with reinforcing elements 4 and these are then connected to the second substrate side 1a, 1b of the glass wafer 1.

As a result, reinforcing elements 4, which are connected to the glass wafer 1 (FIG. 3c), are also arranged in this variant on both substrate sides 1a, 1b of the glass wafer 1. The reinforcing elements 4 are arranged in the regions of the glass wafer 1 which function as inclined optical windows 8.

In the next method step, a further silicon wafer having third depressions 6 is provided as the at least second substrate 5 and is connected to the base stack 7, in particular to the glass wafer 1, by anodic bonding to form a layer system 12. In this case, the base stack 7 and the silicon wafer 5 are arranged in relation to one another so that the third depressions 6 in the silicon wafer 5 form, after the connection to the base stack 7, cavities 10, which are closed off hermetically sealed to the surroundings between the silicon wafer 5 and the base stack 7, which enclose the reinforcing elements 4 facing toward the silicon wafer 5. In addition, the reinforcing elements 4 are arranged non-centrally in the deflection region 21 and therefore between the support surfaces 11 or support regions 11a. A contact does not exist between the reinforcing elements 4 and the silicon wafer 5 before the heating and deforming, as FIG. 3d shows.

The anodic bonding is performed at temperatures of approximately 400° C. and a pressure of approximately 600 mbar or approximately 800 mbar.

During the following process step, the layer system 12 made of silicon wafer 5 and base stack 7 is first heated. If a glass wafer 1 made of borosilicate glass is used, having a softening temperature of approximately 820° C., the layer system 12 made of silicon wafer 5 and base stack 7 is heated to approximately 800° C. Due to the temperature, which is increased in comparison to the bonding process, the pressure in the cavities 10 increases from approximately 600 mbar to approximately 900 mbar or from approximately 800 mbar to approximately 1200 mbar. The corresponding prevailing partial vacuum or overpressure in relation to the atmospheric air pressure of the surroundings results in a force action which pulls the glass substrate 1 into the third depressions 6 of the silicon wafer 5 or presses it out of them, whereby the regions 38 of the glass wafer 1 covered by the reinforcing elements 4 are inclined, as FIGS. 3e and 3f show. The deformation step is terminated upon contact of the reinforcing elements 4 on the bottom 31 of the third depressions 6 or after the pressure in the cavities 10 has reached the value of the ambient pressure because of deformation.

In the last step, the reinforcing elements 4 and the silicon wafer 5 are selectively removed from the glass wafer 1 by wet chemistry (FIG. 3g).

FIG. 4 shows a further process variant to produce a cover 22 having inclined optical windows 8 according to the method according to the invention as claimed in claim 1 while using support structures 13. After providing a glass wafer 1 made of borosilicate glass, reinforcing elements 4 made of silicon and support structures 13 made of silicon, as in the above-described process variant, the reinforcing elements 4 are arranged on both substrate sides 1a, 1b of the glass wafer 1 and are connected by means of anodic bonding to the glass wafer 1 to generate a base stack 7. The support structures 13 are arranged and connected to the glass wafer 1 in the same process steps as the reinforcing elements 4. In this case, support structures 13 are only provided on one substrate side 1b of the glass wafer 1. The reinforcing elements 4 are arranged in the regions of the glass wafer 1 which function as inclined optical windows 8. The support structures 13 are arranged in the regions of the glass wafer 1 which are provided as support surfaces 11 or support regions 11a (FIG. 4a). The support structures 13 form in this case a closed frame around a reinforcing element 4 arranged on the same substrate side 1b of the glass wafer 1 and are used as a protection of the support surfaces 11 of the glass wafer 1 during the contact of the base stack 7 with the second substrate 5. Due to this protection, a direct contact is avoided between the glass wafer 1 and the second substrate 5, whereby the high level of flatness and the slight roughness of the support surfaces 11 can be maintained independently of the surface quality of the second substrate 5.

The reinforcing elements 4 are again arranged non-centrally between the support surfaces 11 or support structures 13.

A substrate or tool which has third depressions 6 is used as the second substrate 5. In addition, the second substrate 5 consists of graphite or at least the counter contact surfaces 14 of the second substrate, which are provided for the contact with the base stack 7, are coated with graphite. Furthermore, this second substrate 5 having graphite has at least one channel 15, which ensures the connection of an external vacuum pump.

Figure 4A:
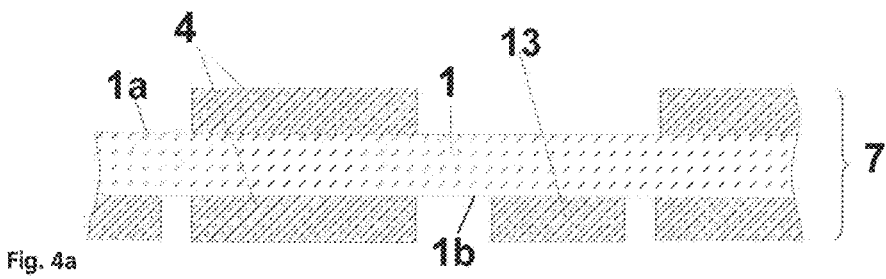
FIGS. 4a-4d show the step sequence of a process variant to produce a cover 22 having inclined optical windows 8 according to the method according to the invention as claimed in claim 1 with the use of support structures 13.
Figure 4B:
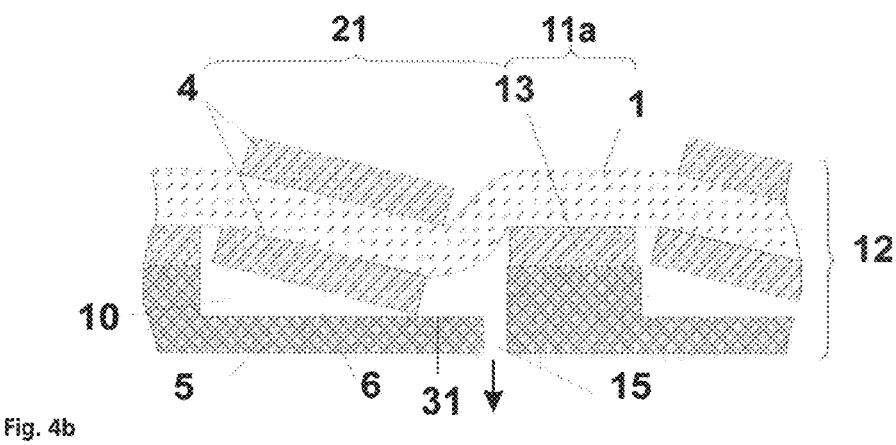

In the next method step, the support structures 13 of the base stack 7 and the second substrate 5 having graphite are brought into contact with one another such that the third depressions 6 in the second substrate 5, after the bringing into contact with the base stack 7, form cavities 10 closed off to the surroundings between the second substrate 5 and the base stack 7, wherein the cavities 10 enclose the reinforcing elements 4, which face toward the second substrate 5, and do not have to be closed off hermetically sealed to the surroundings. A partial vacuum is generated in the cavities 10 via the channels 15 by means of external vacuum pump (FIG. 4b).

Figure 4C:
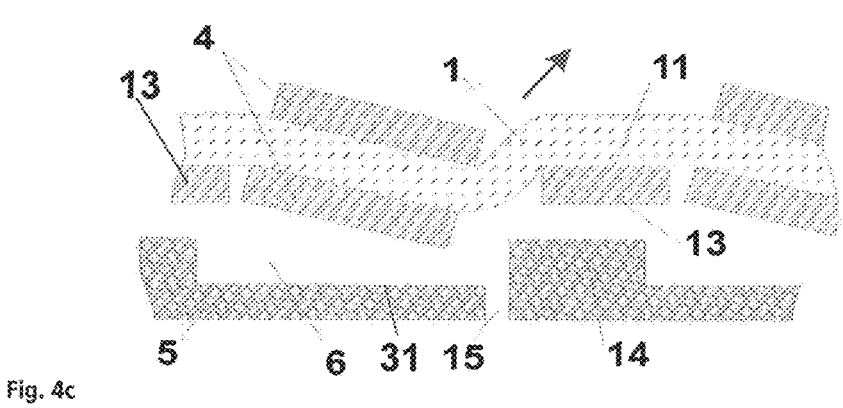

The subsequent heating and deforming step is carried out as described in the previous process variant. Subsequently, ambient pressure (for example, atmospheric air pressure) is again set in the cavities 10. The base stack 7 may thus be lifted off or separated from the second substrate 5, as shown in FIG. 4c.

Figure 4D:
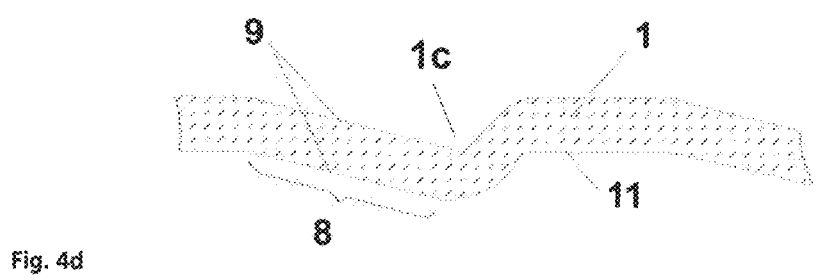
Figure 5A:
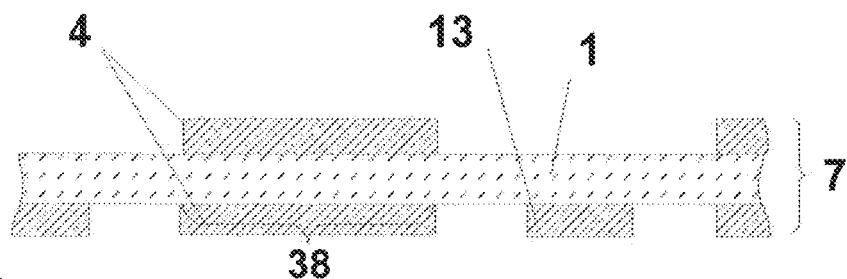
Figure 5B:
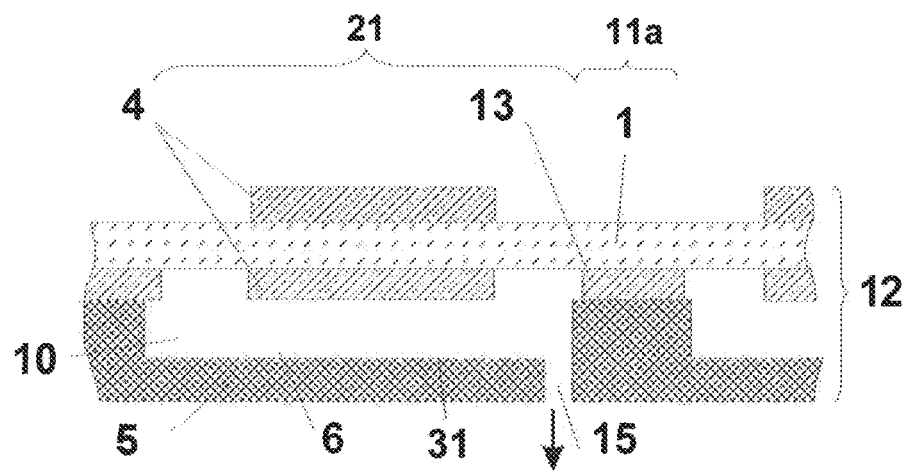
Figure 5C:
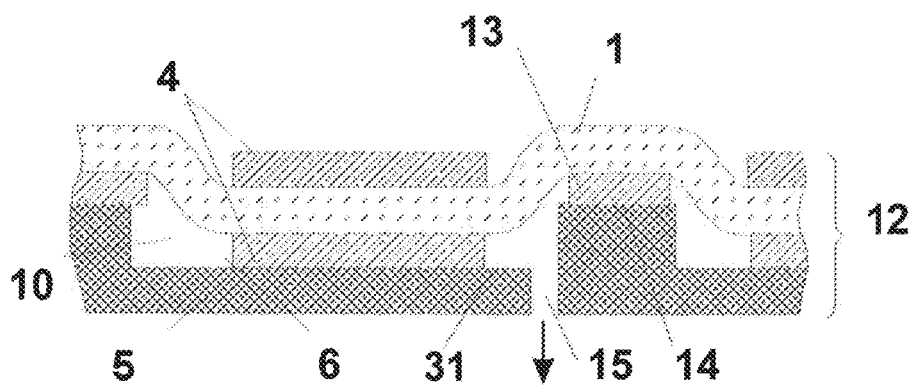
Figure 5D:
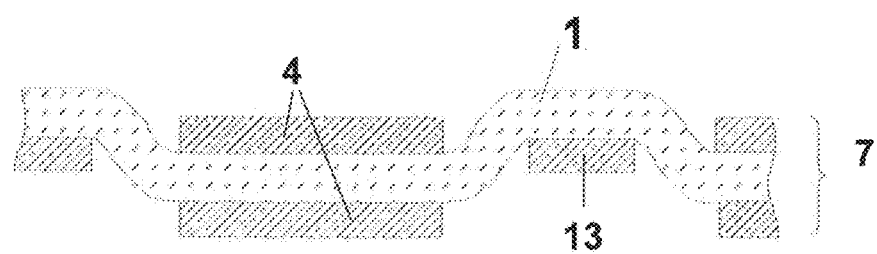
Figure 5E:
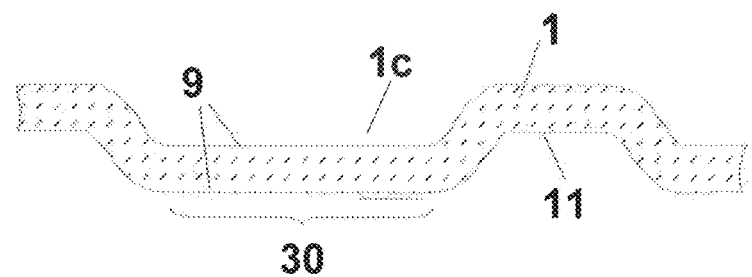
Figure 6A:
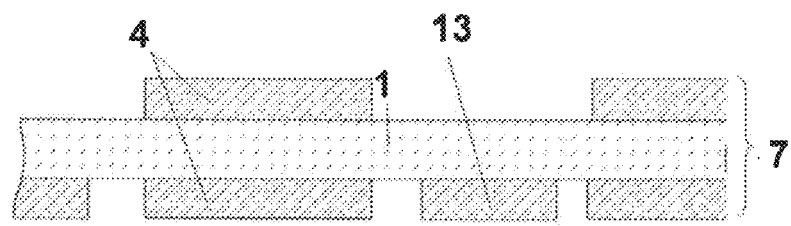
Figure 6B:
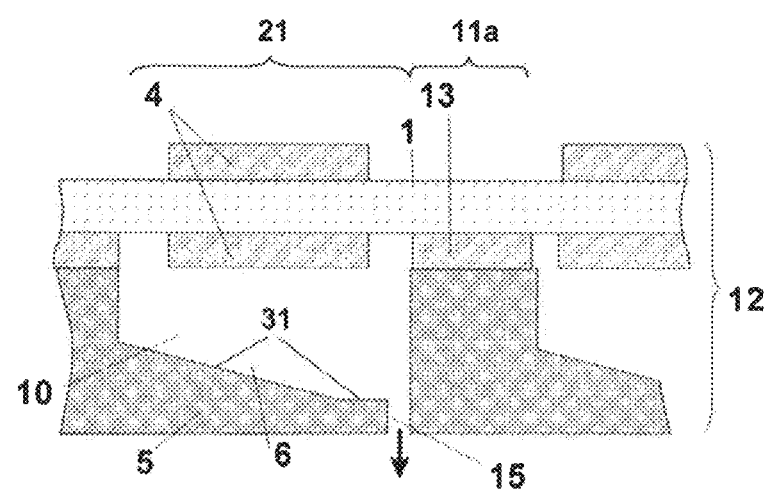
Figure 6C:
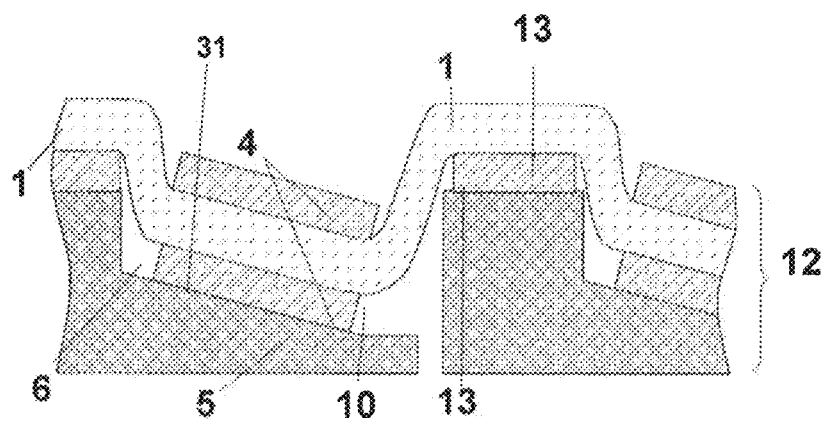
Figure 6D:
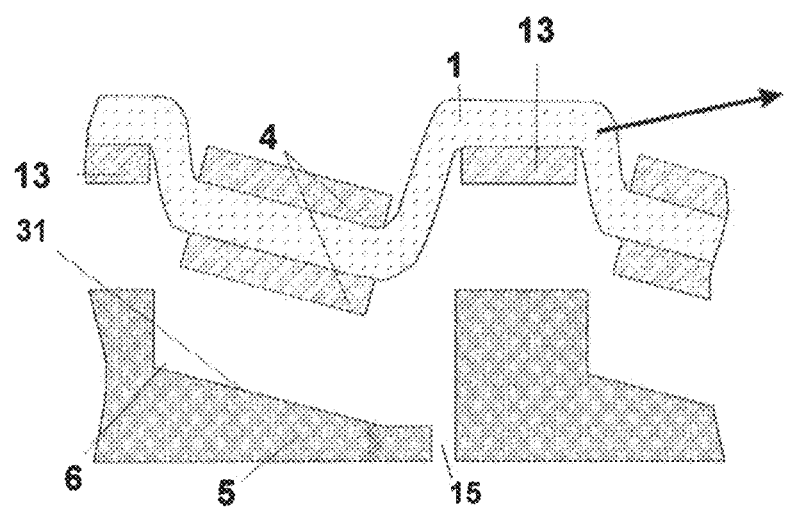
Figure 6E:
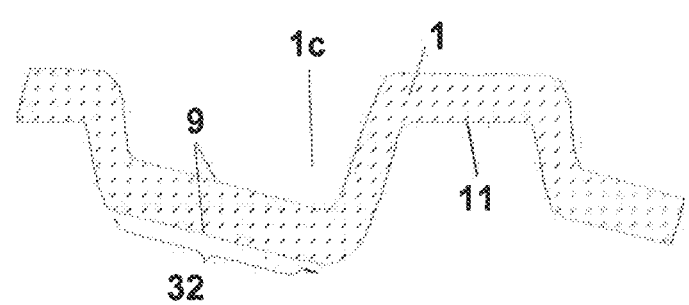
Figure 7A:
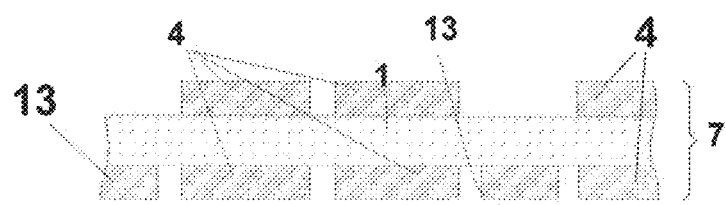
Figure 7B:
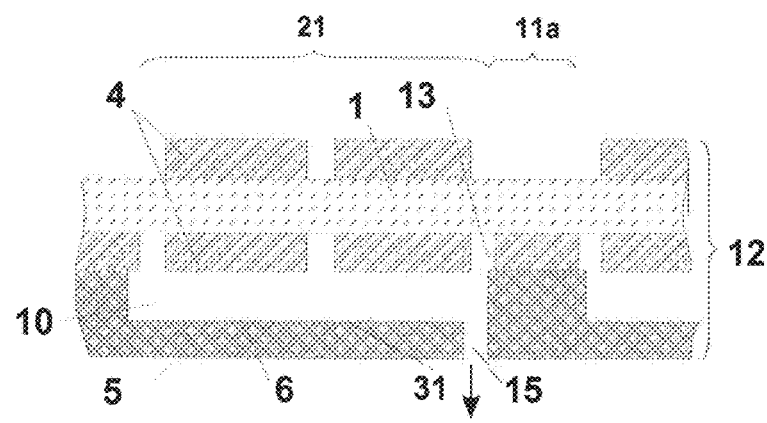
Figure 7C:
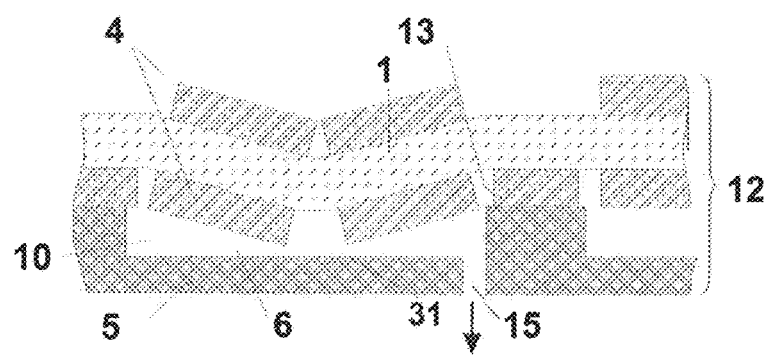
Figure 7D:
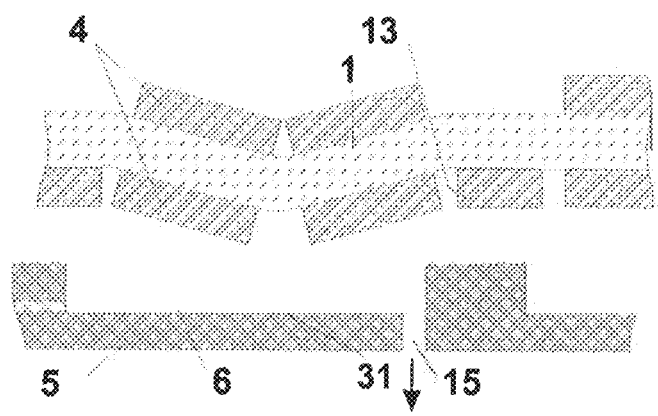
Figure 7E:
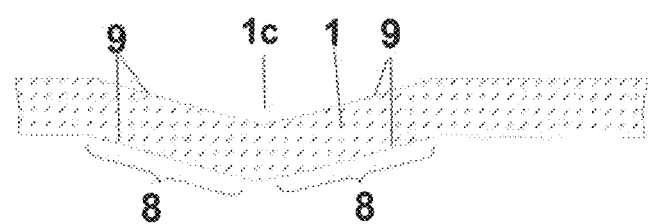
Figure 8A:
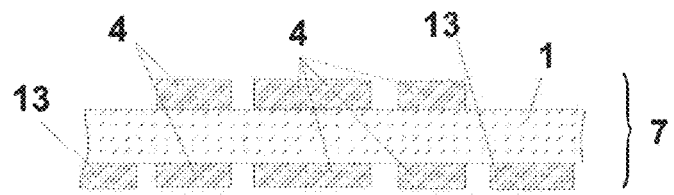
Figure 8B:
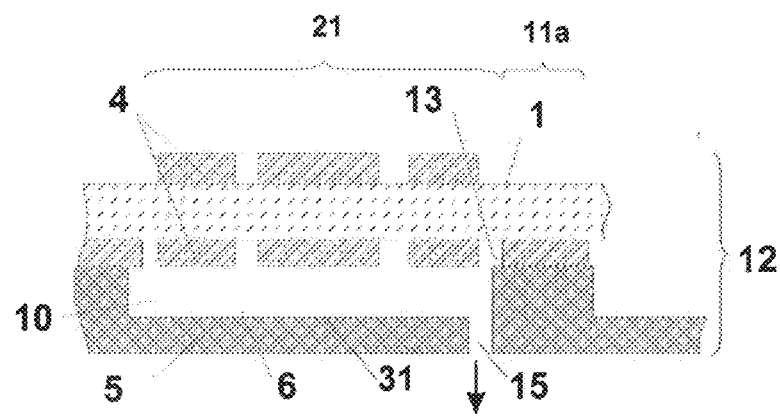
Figure 8C:
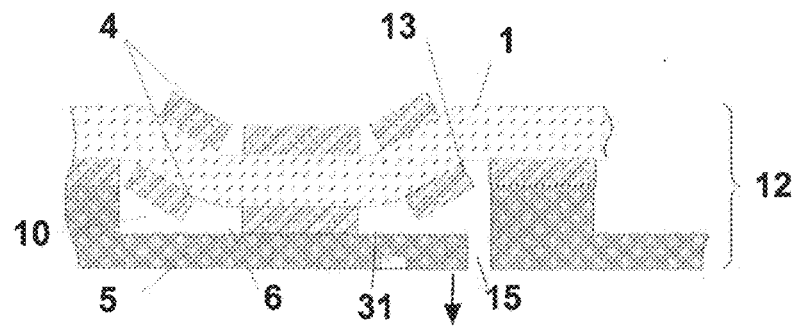
Figure 8D:
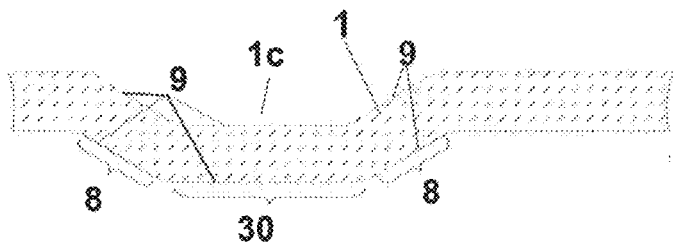

In the final process step, the reinforcing elements 4 and the support structures 13 are removed by wet-chemical selective etching from the glass wafer 1 (FIG. 4d).

FIGS. 5-5.4 show how a cover 22 having optical windows, which are embodied as displaced (displaced optical windows) 30 may be produced using the method according to the invention. This process and the processes described hereafter are based on the above-described process variants.

In the process variants in FIGS. 5.2, 5.3, and 5.4, the reinforcing elements are provided in the already described manner and transferred at least onto the second substrate or arranged thereon.

According to FIGS. 5-5.2 and FIG. 5.4, as described above, a substrate or tool which has third depressions 6 is used for the second substrate 5. According to the method according to FIG. 5.3, support structures 13 are used as spacers between the first substrate 1 and the second substrate 5, so that a flat second substrate 5 can be used.

To increase the position stability of the reinforcing elements 4 on the glass wafer 1 and/or the second substrate 5, the glass wafer 1 (FIG. 5.1) and/or the second substrate 5 (FIGS. 5.2 and 5.4) has alignment depressions 5b, 5c. The risk of a lateral displacement of the reinforcing elements 4 can thus be reduced.

A displacement or a parallel displacement out of the substrate planes 1a, 1b of the regions 38 of the glass wafer 1 covered by the reinforcing elements 4 can be supported by a central arrangement of the reinforcing elements 4 in the deflection regions 21 (FIGS. 5-5.1 and FIG. 5.4) or by an arrangement, in particular a central arrangement, of the reinforcing elements 4 in the regions of the second substrate 5 facing toward the deflection regions 21, for example, the regions between the support structures 13 (FIG. 5.3) or on the bottom 31 of the third depressions 6 (FIG. 5.2).

The deformation step can be performed until the reinforcing elements 4 or the glass wafer 1 rest on the bottom 31 of the third depressions 6 of the second substrate 5 or the reinforcing elements 4 arranged therein.

According to the method according to FIG. 5.4, reinforcing elements 4 made of silicon, which are sawn out of a reinforcing substrate 4a, are arranged on the second substrate 5. In addition, a glass wafer 1 is provided, which has reinforcing elements 4 made of silicon. The processing of this arrangement can be performed, for example, such that a silicon wafer is provided as a reinforcing layer 4a, which has second depressions 4b on the wafer side to be brought into connection with the glass wafer 1. The second depressions 4b are to avoid a contact between glass wafer 1 and silicon wafer 4a during the connection of glass wafer 1 and silicon wafer 4a in the regions of the glass wafer 1 in which no reinforcing elements 4 are provided, to preserve these regions of the glass wafer 1 for further connecting and/or contacting steps, for example, anodic bonding of the glass wafer 1 to the second substrate 5. The second depressions 4b have depths of approximately 0.7 µm.

The silicon wafer 4a is connected to one of the substrate sides 1a, 1b of the glass wafer 1 to form a further base stack 7 by means of anodic bonding.

In the subsequent structuring process, the silicon wafer 4a of the further base stack 7 is structured by wet-chemical etching methods and/or dry-etching methods such that in the regions of the glass wafer 1 which function as optical windows 30, silicon remains as the reinforcing elements 4 (FIG. 5.4c). As a result, the individual reinforcing elements 4 are completely enclosed or separated from one another by regions of the glass wafer 1 which are freed of silicon.

By way of an embodiment of the bottoms 31 of the third depressions 6 which is inclined at least in partial regions and/or a non-central arrangement of the reinforcing elements 4 in the deflection regions 21, a cover 22 having optical windows 32 embodied as displaced and inclined may be produced, as shown in FIGS. 6-6.3.

In the process variant according to FIG. 6.1, the position stability of the reinforcing elements 4 is again improved by alignment depressions 5c in the second substrate 5 (FIG. 6.1b_1). In the course of the heating and deforming, the glass wafer 1 is brought into contact with the reinforcing elements 4. The bringing into contact results, because of the high heating temperature of, for example, 800° C. due to a thermal bonding operation, in an integrally joined connection between the glass wafer 1 and the reinforcing elements 4. After ambient pressure has been produced in the third depressions 6 of the second substrate 5, the glass wafer 1 having the reinforcing elements 4 can be lifted off of the second substrate 5. Because of this material-preserving separating method, the second substrate 5 may be reused. After the glass wafer 1 having the reinforcing elements 4 is lifted off of the second substrate 5, the reinforcing elements 4 can be removed from the glass wafer 1 by means of wet-chemical selective etching.

Alternatively, as shown in FIG. 6.2, the surface regions of the covered regions 38 of the glass wafer 1, on which no reinforcing elements 4 are arranged and which are provided, for example, as transmission surfaces 9 of the optical windows 32, can be subjected to a further shaping process, in order to improve the surface quality impaired by the first shaping process, for example, in particular flatness deviations, for example, sagging, in particular to planarize it.

For this purpose, reinforcing elements 4, which function in particular as molding elements, are arranged on a further second substrate 5a, and the substrate side 1a of the glass wafer 1, which does not have reinforcing elements 4, is brought into contact with the further second substrate 5a or the reinforcing elements 4 arranged thereon. In the example according to FIG. 6.2c, only the regions of the glass wafer 1 functioning later as contact regions or contact surfaces, or only the wafer edge of the glass wafer 1 are brought into contact with the further second substrate 5a. Alternatively, in particular additionally, at least partial regions of the covered regions 38 of the glass wafer 1 can be brought into contact with the reinforcing elements 4 arranged on the further second substrate 5*a*. A following heating and deforming step of the glass wafer 1 results in molding of the surface regions of the reinforcing elements 4, which are arranged on the further second substrate 5*a* and face toward the glass wafer 1, on the glass wafer 1. Since the corresponding surface regions of the reinforcing elements 4 are embodied as polished, their high surface quality, in particular the slight roughness and the high level of flatness, is transferred to the glass wafer 1. As a result, the optical windows 32 (or their transmission surfaces 9) of the produced cover 22 have a high surface quality on both sides.

Alternatively to the combination of the process variants according to FIGS. 6.1 and 6.2, as shown in FIG. 6.3, a substrate side 1*b* of the glass wafer 1 can be provided with reinforcing elements 4 before the heating and deforming, and the other substrate side 1*a* of the glass wafer 1 is brought into contact in the course of the heating and deforming with reinforcing elements 4 arranged on the second substrate 5. Regions of the glass wafer 1 supported on both sides by reinforcing elements 4 thus also result, which have a high surface quality after the removal of the reinforcing elements 4.

Further modifications of the described process variants to produce a cover 22 according to the method according to the invention are shown in FIGS. 7-7.3 and FIGS. 8-8.4.

By arranging multiple reinforcing elements 4 in one deflection region 21 (for example, FIGS. 7, 7.2-7.3, FIGS. 8-8.1, 8.3) and/or in a region of the second substrate 5 facing toward the deflection region 21 (for example, FIG. 7.3, FIGS. 8.1-8.3) or by way of the use of specially structured reinforcing elements 4 (for example, FIG. 7.1, FIG. 8.4), multiple displaced and/or inclined regions of the glass wafer 1 or optical windows 8, 30, 32 may be implemented in one deflection region 21 by the heating and deforming.

The alignment depressions 5*b* in the glass wafer 1 (see FIG. 7.2*c*) can be reduced or can disappear completely due to the heating and deforming and the glass flow connected thereto.

Finally, the reinforcing elements 4 and the support structures 13 are removed by wet-chemical selective etching from the glass wafer 1.

In the process variants according to FIG. 7.1 and FIG. 8.4, specially structured reinforcing elements 4 are used, which have surface regions which are implemented as inclined to the substrate plane(s) 1*a*, 1*b* or to parts of the surface regions of the deflection regions of the glass wafer 1 before the heating and deforming, and are brought into contact with regions of the glass wafer 1 in the further process operation. A support of the shaping of the glass wafer 1 by the reinforcing elements 4 is ensured by the guiding of the deformation of the glass wafer 1 caused by the reinforcing elements 4 and/or the molding of the inclined surface regions of the reinforcing elements 4 on the glass wafer 1. The reinforcing elements 4 additionally also have a region functioning as a fixing element 16 and/or a region functioning as a support structure 13 (for example, as a spacer). Such inclined surface regions of the reinforcing elements 4 having high surface quality can be generated, for example, by a KOH etching process in <111> silicon.

Figure 9A:
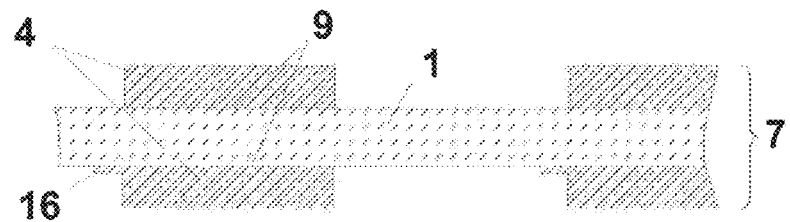

FIGS. 9-9.1 show the use of fixing elements 16 during the production of a cover 22 according to the method according to the invention as claimed in claim 1. The fixing elements 16 can be generated during the production of the reinforcing elements 4.

Figure 9B:
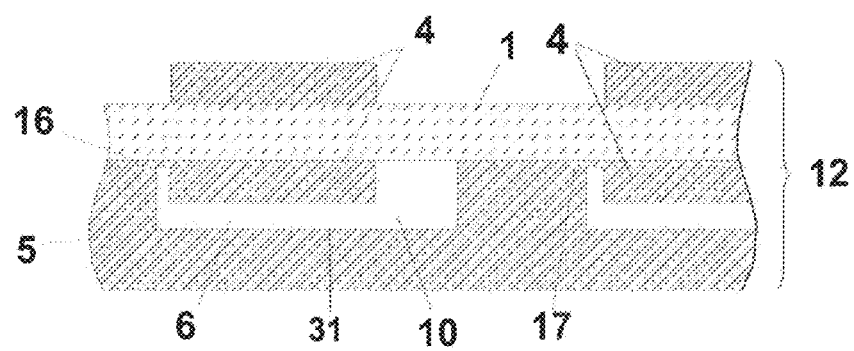

During the following anodic bonding of base stack 7 and the second substrate 5, for example, a silicon wafer, the fixing elements 16 according to FIG. 9 are clamped between the surfaces to be connected and therefore fixed. In order to be able to ensure a stable connection between the base stack 7 and the second substrate 5 in spite of the fixing elements 16, the second substrate 5 is designed with receptacle grooves 17 for the fixing elements 16 (FIG. 9*b*).

Alternatively, the reinforcing elements 4 can be connected via the fixing elements 16 to rigid regions or regions which are dimensionally stable in the further process operation of the first substrate 1 (FIG. 9.1*b*) and/or the second substrate 5 (FIG. 9.1*b*_1). Such a stable connection can be ensured by anodic or thermal bonding.

Figure 9C:
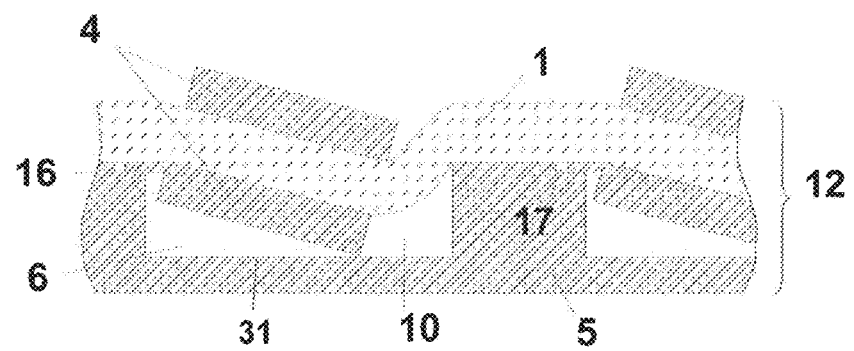

During the subsequent heating and deforming, the clamped or bonded fixing elements 16 prevent displacement and/or twisting of the reinforcing elements 4. In addition, the fixing elements 16 reduce undesired deformations, for example, sagging, in the regions 38 of the glass wafer 1 covered by the fixing elements 16 (FIG. 9*c*, 9.1*c*_1). In the process variant according to FIG. 9.1*b*_1, the fixing elements 16 additionally function as support structures 13, which are used as spacers.

In the above-mentioned process variants, the deformation of the glass wafer 1 is assisted by a force which results from a pressure difference between ambient pressure and the pressure prevailing in the cavities 10 enclosed by the (further) base stack 7 or the glass wafer 1 and the second substrate 5 or the base stack 7*a*.

Figure 10A:
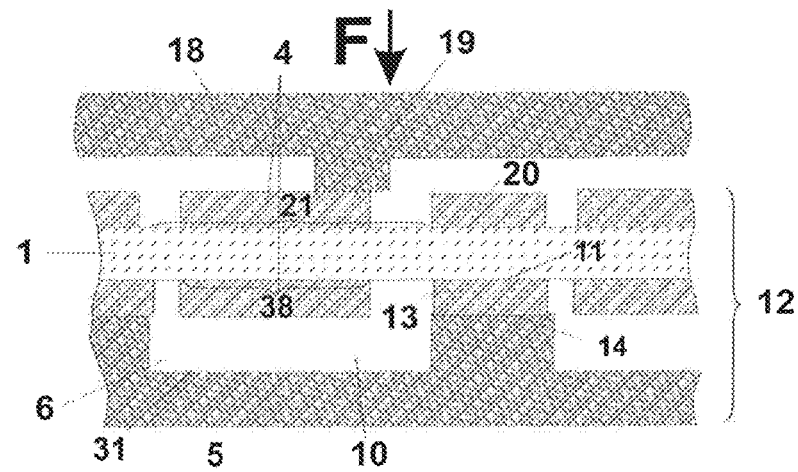
FIGS. 10a-10c show the introduction of a force, which is caused by mechanical interaction, by means of shaping devices 18.

In a further process variant according to FIG. 10, this force is introduced by a shaping device 18 having a stamp element 19. In this case, the stamp element 19 is aligned so that the force does not act centrally in relation to the reinforcing elements 4 or the deflection region 21 (FIG. 10*a*). An inclination of the reinforcing elements 4 and the regions 38 of the glass wafer 1 covered thereby is thus promoted. The force is maintained until the desired inclination of the regions 38 of the glass wafer 1 covered by the reinforcing elements 4 is achieved.

Figure 10B:
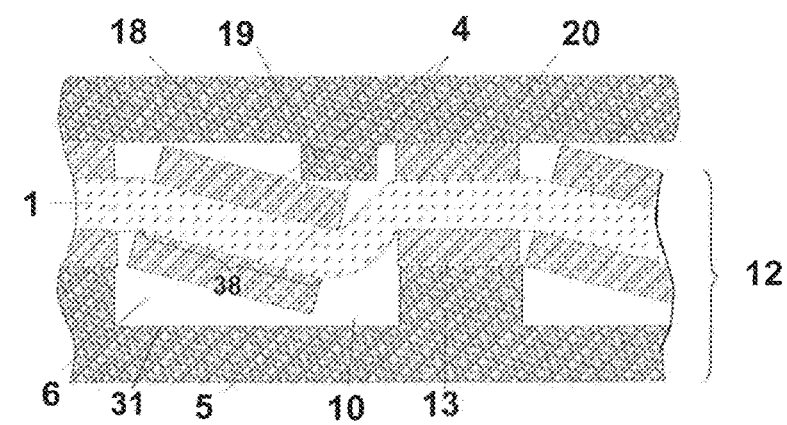
Figure 10C:
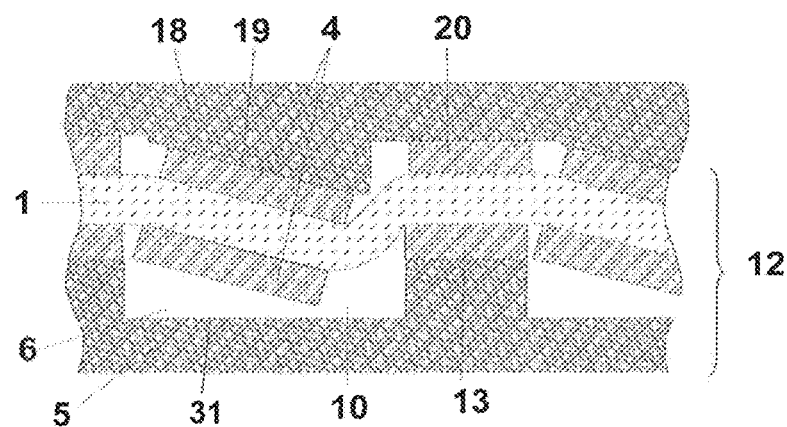

To increase the precision of the inclination of the inclined optical windows 8, special stop structures 20, which delimit the maximum deflection of the stamp element 19, are applied or arranged on the glass wafer 1. These stop structures 20 can be applied in the form of one or multiple layers or layer sequences on the glass wafer 1. The maximum deflection of the stamp element 19 and therefore the desired inclination may be set by the variation of the thickness of the layers or layer sequences. The shaping process is completed as soon as the shaping device 18 comes into contact with the stop structures 20, as shown in FIG. 10*b*. The stop structures 20 may be arranged on the glass wafer 1 and connected to the glass wafer 1 as described for the reinforcing elements 4 and/or support structures 13.

A further increase of the precision of the shaping process may be achieved by a stamp element 19, which has an inclined stamp surface (FIG. 10*c*), which has the desired inclination for the optical windows 8.

The shaping device 18 can be designed so that it can be used multiple times, for example, in that a direct contact of the shaping device 18 with the glass wafer 1 is avoided (FIG. 10).

The process variant according to FIG. 11 shows the production of a cover 22 having optical windows 32 embodied as displaced and inclined, which are provided on one side with moth-eye structures 40 as a functional surface structure.

Figure 11A:
FIGS. 11a-11f show the step sequence of a process variant to produce a cover 22 having optical windows 32, which are embodied as displaced and inclined, having moth-eye structures as a functional surface structure.
Figure 11B:
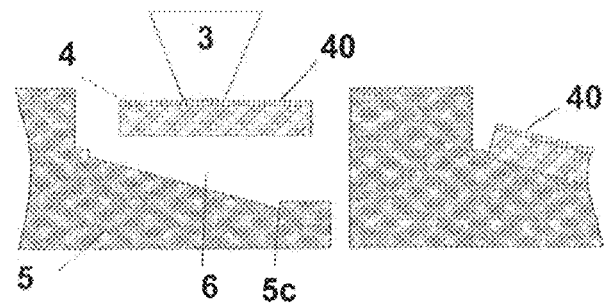
Figure 11C:
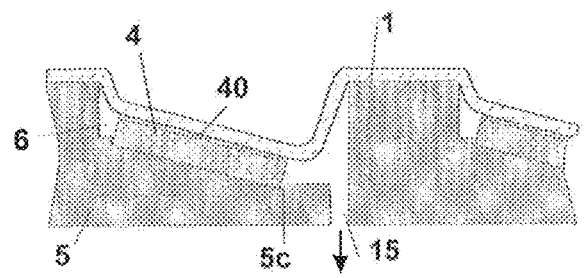
Figure 11D:
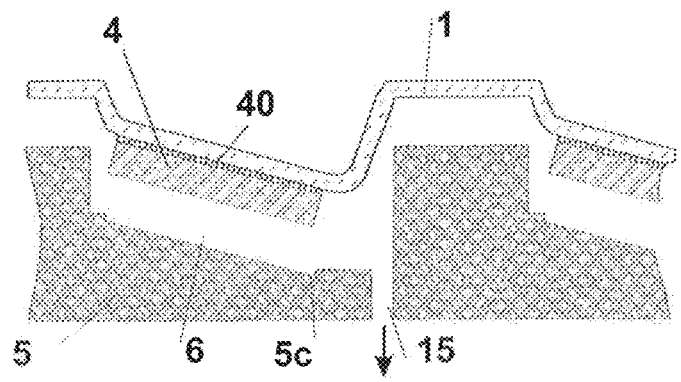
Figure 11E:
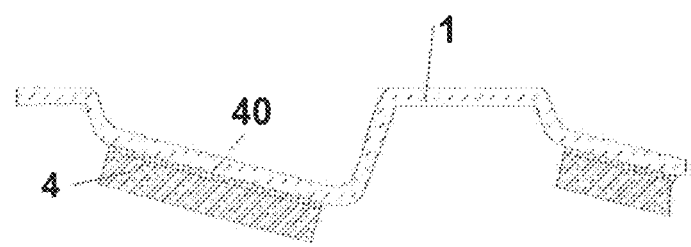

The reinforcing elements 4 made of silicon are provided with a silicon dioxide layer in this case before the arrangement on the second substrate 5 on the side which is brought into contact with the glass wafer 1 during the heating and deforming. The silicon dioxide layer is structured such that as a result, the reinforcing elements 4 have moth-eye structures 40 made of silicon dioxide (FIG. 11*a*).

The reinforcing elements 4 are arranged thereafter by means of vacuum handler 3 on the second substrate 5 (FIG. 11*b*), so that the side of the reinforcing elements 4 which is provided with the moth-eye structures 40 faces toward the glass wafer 1 after the arrangement of the glass wafer 1 on the second substrate 5.

The glass wafer 1 is brought into contact with the reinforcing elements 4 or the moth-eye structures 40 by the heating and deforming (FIG. 11*c*), wherein a thermal bonding process causes an integrally joined connection between moth-eye structures 40 and glass wafer 1 as a result of the process temperatures.

Figure 11F:
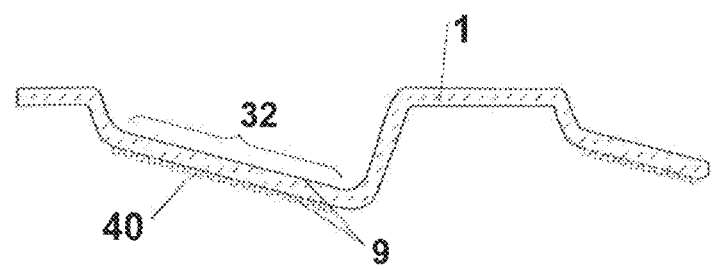

After separation of the structured glass wafer 1 from the second substrate 5 (FIG. 11*d*), the silicon of the reinforcing elements 4 is removed, whereby a cover 22 results, the windows 32 of which, which are embodied as displaced and inclined, are provided at least on one of the transmission surfaces 9 with moth-eye structures 40 (FIG. 11*f*). Based on the above-described process variants, windows 8, 30, 32 may also be produced, in which both transmission surfaces 9 are provided with moth-eye structures.

The process variant according to FIG. 12 shows the production of a cover 22, which is not embodied in one piece, having inclined optical windows 8.

A glass wafer 1 made of borosilicate glass, which is provided with feedthroughs 6*b*, forms the starting point. The feedthroughs 6*b* can be generated by means of drilling (for example, ultrasonic drilling, laser drilling). Thereafter, the glass wafer 1 is connected to a reinforcing substrate 4*a* made of high-temperature-resistant or high-melting-point glass (e.g., Corning Eagle XG®, Corning Lotus Glass®, Schott AF32®) by a thermal bonding process. Alternatively, the connection can also be produced by an anodic bonding process, wherein in this case a silicon layer is deposited on the side of the reinforcing substrate 4*a* to be connected to the glass wafer 1 before the connecting step. After the anodic bonding, this silicon layer is removed (for example, by means of wet-chemical etching) in the regions of the reinforcing substrate 4*a* which are to function as optical windows.

Figure 12A:
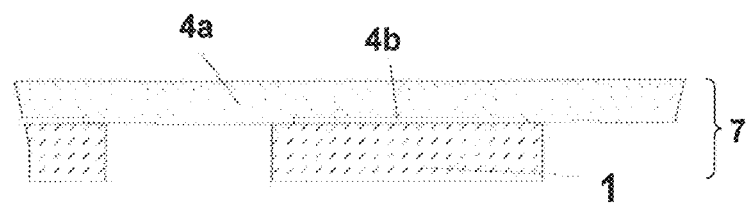
FIGS. 12a-12f show the step sequence of a process variant to produce a cover 22, which is not embodied in one piece, having inclined optical windows 8.
Figure 12B:
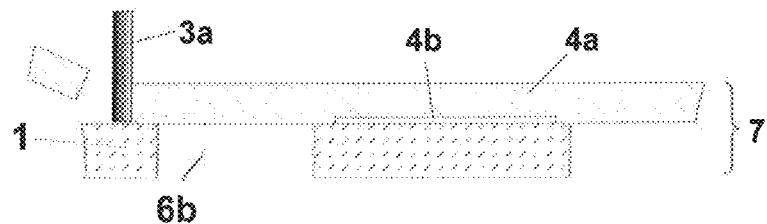
Figure 12C:
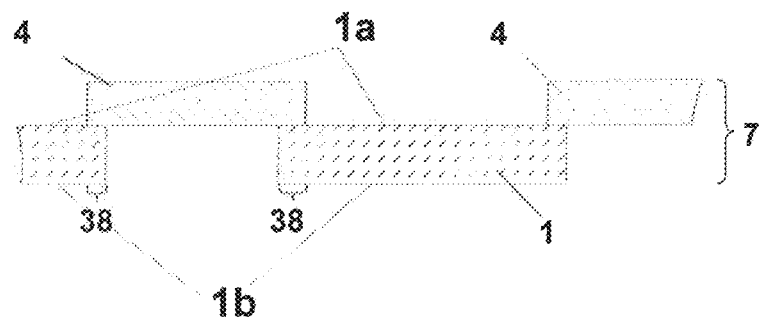
Figure 12D:
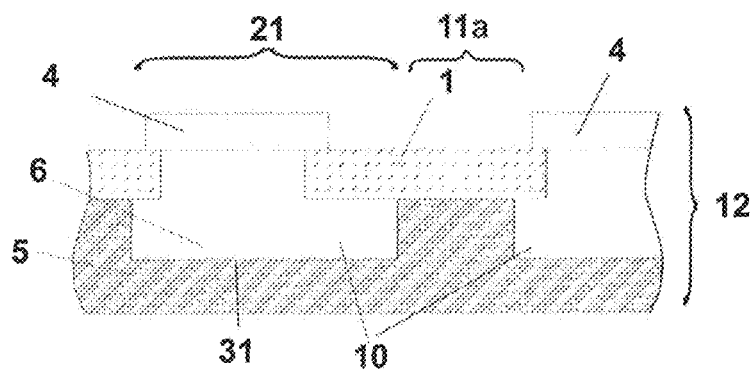
Figure 12E:
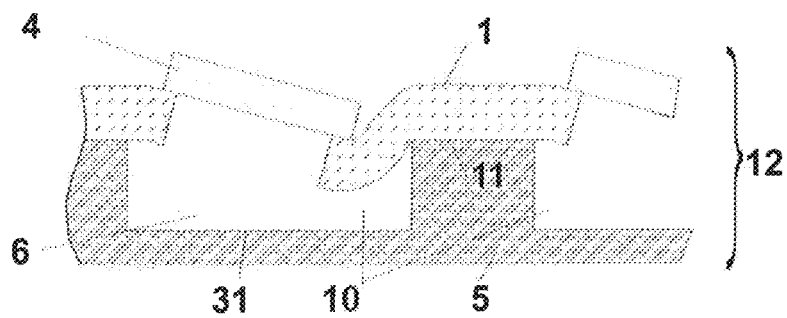
Figure 12F:
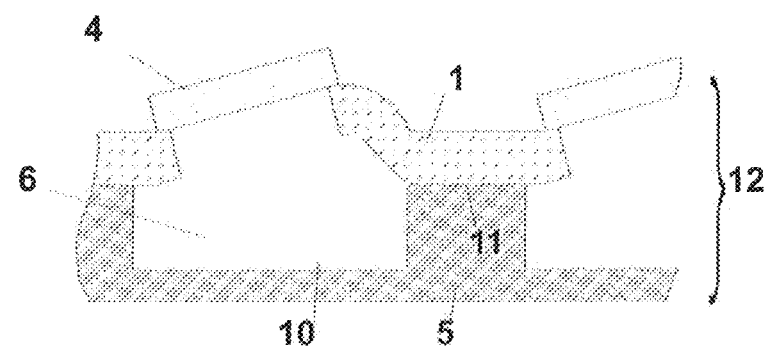
Figure 12F:
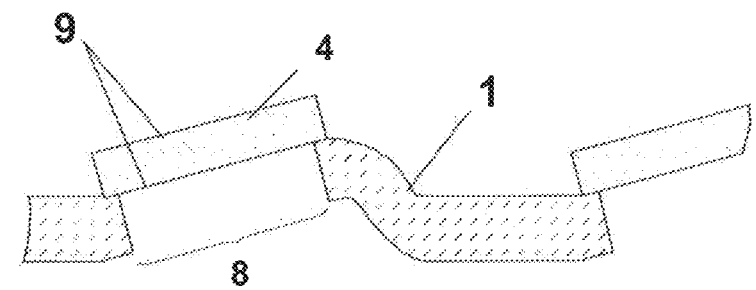

Both substrate sides of the reinforcing substrate 4*a* are embodied as polished and plane-parallel. In addition, the reinforcing substrate 4*a* has second depressions 4*b*, which prevent a contact of the saw 3*a* with the glass wafer 1 during the following sawing step to generate the reinforcing elements 4 (FIG. 12*b*). Alternatively, the reinforcing elements 4 can be generated before the arrangement on the glass wafer 1 (for example, by sawing) and then arranged on the glass wafer 1 by means of vacuum handler 3. The base stack 7 made of glass wafer 1 and reinforcing elements 4 is arranged on a second substrate 5 made of graphite, which has third depressions 6 (FIG. 12*d*). During the heating and deforming, displacement and/or inclination of the covered regions 38 of the glass wafer 1 are promoted because of the pressure difference between the pressure in the cavities 10 and the ambient pressure. Since the reinforcing elements 4 consist of a higher-melting-point glass than the glass wafer 1, their shape and their structure are maintained during the heating and deforming. Since the substrate sides of the reinforcing substrate 4*a* are embodied as plane-parallel and polished, the reinforcing elements 4 remain on the glass wafer 1 and function as inclined optical windows 8, whose transmission surfaces 9 have a high surface quality, in particular a slight flatness deviation and roughness.

LIST OF REFERENCE SIGNS

1 first substrate, for example, glass wafer
1*a* first substrate plane or substrate side of the first substrate
1*b* second substrate plane or substrate side of the first substrate
1*c* first depression in the first substrate
2 receptacle substrate
3 vacuum handler
3*a* saw
4 reinforcing element or further reinforcing element
4*a* reinforcing substrate or reinforcing layer
4*b* second depression in the reinforcing substrate or in the reinforcing layer
5 second substrate, for example, silicon wafer
5*a* further second substrate
5*b* alignment depression in the first substrate
5*c* alignment depression in the second substrate
6 third depression in the second substrate
6*b* feedthrough in the first substrate
7 base stack or further base stack
7*a* main stack
8 inclined optical window
9 transmission surface of the optical window
10 cavity between base stack and second substrate or first substrate/further base stack and main stack
11 support surface
11*a* support region
12 layer system made of base stack and second substrate or first substrate/further base stack and main stack
13 support structure
14 counter contact surface of the second substrate
15 channel in the second substrate, for example, as a connection for a vacuum pump
16 fixing element
17 receptacle groove in the second substrate
18 shaping device
19 stamp element, for example, having linear or beveled stamp surface
20 stop structure
21 deflection region
22 cover
23 contact surface of the cover
24 carrier substrate
25 micromirror
26 suspension of the micromirror
27 contact pad
28 incident radiation
29 deflected radiation
30 displaced optical window
31 bottom of the third depression in the second substrate
32 optical window embodied as displaced and inclined
34 cover unit
36 delimitation surface of the receptacle substrate
37 receptacle depression
38 covered region of the first substrate
40 moth-eye structure

We claim:
1. A method for producing optical components having the following steps:
   providing a first substrate (1) and a second substrate (5),
   providing at least one reinforcing element (4) by detaching it from a reinforcing substrate (4*a*), generating a stack (7) by arranging the at least one reinforcing element (4) on the first substrate (1), whereby the reinforcing element (4) covers a region of the first substrate (1), bringing the second substrate (5) into contact with the stack (7), heating and deforming the first substrate (1) such that at least a part of the region of the first substrate (1) covered by the at least one reinforcing element (4) is displaced and/or inclined, and/or a region of the first substrate (1) is brought into contact with the at least one reinforcing element (4).

2. A method for producing optical components having the following steps:

providing a first substrate (1) and a second substrate (5),
providing at least one reinforcing element (4) by detaching it from a reinforcing substrate (4a),
generating a stack (7a) by arranging the at least one reinforcing element (4) on the second substrate (5),
bringing the first substrate (1) into contact with the stack (7a),
heating and deforming the first substrate (1) such that a region of the first substrate (1) is brought into contact with the at least one reinforcing element (4).

3. The method as claimed in claim 2, characterized in that the provided first substrate (1) has a further reinforcing element (4), wherein the further reinforcing element (4) covers a region of the first substrate (1) and the first substrate (1) and the further reinforcing element (4) form a further stack (7), which is brought into contact with the stack (7a) made of reinforcing element (4) and second substrate (5) during the step of bringing into contact, and wherein the heating and deforming of the first substrate (1) are additionally performed such that at least a part of the region of the first substrate (1) covered by the further reinforcing element (4) is displaced and/or inclined, and/or a region of the first substrate (1) is brought into contact with the further reinforcing element (4).

4. The method as claimed in claim 3, characterized in that the provision of the first substrate (1) with the further reinforcing element (4) is performed such that the further reinforcing element (4) is provided by detaching it from a reinforcing substrate (4a) and is arranged on the first substrate (1) and/or the further reinforcing element is provided by applying a reinforcing layer to the first substrate (1), and structuring the reinforcing layer to generate the further reinforcing element (4).

5. The method as claimed in claim 2, characterized in that the generation of the stack (7a) and its bringing into contact with the further stack (7) or the first substrate (1) are performed such that the at least one reinforcing element (4) is at least partially arranged between the first substrate (1) and the second substrate (5).

6. The method as claimed in claim 1, characterized in that the first substrate (1) contains or consists at least in partial regions of glass and/or a glasslike material.

7. The method as claimed in claim 1, characterized in that the reinforcing substrate (4a) is a plate or a wafer.

8. The method as claimed in claim 1, characterized in that the reinforcing substrate (4a), the at least one reinforcing element (4), and/or the further reinforcing element (4) contain or consist at least in partial regions of a semiconductive material.

9. The method as claimed in claim 1, characterized in that the difference of the coefficient of thermal expansion of the material of the first substrate (1) and the coefficient of thermal expansion of the material of the at least one reinforcing element (4) and/or the further reinforcing element (4) is less than or equal to 5 ppm/° K.

10. The method as claimed in claim 1, characterized in that the provision of the at least one reinforcing element (4) and/or the further reinforcing element (4) is performed by sawing, laser cutting, fracture, and/or etching.

11. The method as claimed in claim 1, characterized in that a surface region of the at least one reinforcing element (4) and/or the further reinforcing element which is brought into contact with the first substrate, has an RMS surface roughness less than or equal to 25 nm and/or a flatness deviation less than or equal to 180 nm.

12. The method as claimed in claim 1, characterized in that the at least one reinforcing element (4) and/or the further reinforcing element (4) is arranged on a positioning means (2) before the arrangement on the first substrate (1) and/or second substrate (5).

13. The method as claimed in claim 1, characterized in that the at least one reinforcing element (4) and/or the further reinforcing element (4) has at least one fixing element (16) which, in particular after the stack (7a) is brought into contact with the further stack (7) or the stack (7, 7a) is brought into contact with the substrate (1, 5) not comprised by the stack (7, 7a), reduces or prevents displacement and/or twisting of the at least one reinforcing element (4) and/or the further reinforcing element (4) in relation to the first substrate (1) and/or in relation to the second substrate (5).

14. The method as claimed in claim 1, characterized in that one or more support structures (13) are generated, wherein the generation of the support structure (13) is performed such that the support structure (13) protects the support region (11a) of the first substrate (1) and/or functions as a spacer between the first substrate (1) and the second substrate (5).

15. The method as claimed in claim 1, characterized in that at least one reinforcing element (4) is arranged on each of the two substrate sides (1a, 1b) of the first substrate (1).

16. The method as claimed in claim 1, characterized in that the arrangement of the at least one reinforcing element (4) on the first substrate (1) and/or the second substrate (5) and/or the arrangement of the further reinforcing element (4) on the first substrate (1) is performed by anodic bonding, direct bonding, plasma-activated bonding, and/or thermal bonding, and/or at least partial regions of the regions of the first substrate (1) and the reinforcing element (4) and/or the further reinforcing element (4) brought into contact with one another by the heating and deforming are connected to one another by thermal bonding.

17. The method as claimed in claim 1, characterized in that the at least one reinforcing element (4) and/or the further reinforcing element (4) is at least partially removed after the deforming.

18. The method as claimed in claim 17, characterized in that the removal of the at least one reinforcing element (4) and/or the further reinforcing element (4) is performed such that the at least one reinforcing element (4) and/or the further reinforcing element (4) is reusable.

19. The method as claimed in claim 17, characterized in that the at least one reinforcing element (4) and/or the further reinforcing element (4), at least in the region which is brought into contact with the first substrate (1), has a sacrificial layer, which is removed after the deformation of the first substrate (1) to release the reinforcing element (4) and/or the further reinforcing element (4).

20. The method as claimed in claim 1, characterized in that the first substrate (1) is provided at least in partial regions with at least one finishing coating, and/or an absorption coating, and/or functional surface structures.

21. The method as claimed in claim 20, characterized in that moth-eye structures (40) are generated as the functional surface structure such that, before the arrangement and/or the bringing into contact of the at least one reinforcing element (4) and/or the further reinforcing element (4) on/with the first substrate (1), at least the region of the at least one reinforcing element (4) and/or the further reinforcing element (4), which is brought into contact with the first substrate (1), is provided with a negative mold of the moth-eye structures (40) and, after the arrangement and/or the bringing into contact of the at least one reinforcing element (4) and/or the further reinforcing element (4) on/with the first substrate (1) during the shaping of the first substrate (1), the moth-eye structures (40) are generated on the first and/or second substrate side (1a, 1b) of the first substrate (1), in that the negative mold in the at least one reinforcing element (4) and/or the further reinforcing element (4) is molded on the first and/or second substrate side (1a, 1b) of the first substrate (1), in particular on the transmission surfaces (9) of the optical windows (8, 30, 32).

22. The method as claimed in claim 20, characterized in that the finishing coating is generated such that, before the arrangement and/or the bringing into contact of the at least one reinforcing element (4) and/or the further reinforcing element (4) on/with the first substrate (1), at least the region of the at least one reinforcing element (4) and/or the further reinforcing element (4), which is brought into contact with the first substrate (1), is provided with the finishing coating and subsequently a connection is produced between the first substrate (1) and the at least one reinforcing element (4) and/or the further reinforcing element (4) by a connection between the finishing coating and the first substrate (1), or, before the arrangement and/or the bringing into contact of the at least one reinforcing element (4) and/or the further reinforcing element (4) on/with the first substrate (1), the finishing coating is applied to the first substrate (1) and subsequently the at least one reinforcing element (4) and/or the further reinforcing element (4) is arranged and/or brought into contact on/with the finishing coating, wherein after the deformation step, the at least one reinforcing element (4) and/or the further reinforcing element (4) is at least partially removed and the finishing coating remains on the first substrate (1), in particular on the optical windows (8, 30, 32).

23. The method as claimed in claim 2, characterized in that the generation of the stack (7a) and its bringing into contact with the further stack (7) or the first substrate (1) are performed such that the at least one reinforcing element (4) is at least partially on the substrate side of the second substrate (5) facing toward the first substrate (1).

24. The method as claimed in claim 6, wherein said glass comprises borosilicate glass.

25. The method as claimed in claim 8, wherein said semiconductive material comprises silicon.

26. The method as claimed in claim 9, wherein the coefficient of thermal expansion is less than or equal to 1 ppm/° K.

27. The method as claimed in claim 11, wherein said RMS surface roughness is less than or equal to 5 nm and/or a flatness deviation less than or equal to 110 nm.

28. The method as claimed in claim 12, wherein said positioning means comprises a receptacle substrate.

29. The method as claimed in claim 20, wherein said finishing coating comprises an antistatic coating, a reflective coating and/or an absorption coating and wherein said functional surface structures comprises moth-eye structures.

* * * * *